United States Patent
Sugamoto

(10) Patent No.: US 9,236,097 B2
(45) Date of Patent: Jan. 12, 2016

(54) SEMICONDUCTOR MEMORY DEVICE AND DATA READING METHOD

(75) Inventor: Hiroyuki Sugamoto, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 170 days.

(21) Appl. No.: 13/620,184

(22) Filed: Sep. 14, 2012

(65) Prior Publication Data

US 2013/0070538 A1    Mar. 21, 2013

(30) Foreign Application Priority Data

Sep. 20, 2011    (JP) ................................. 2011-205041

(51) Int. Cl.
| | |
|---|---|
| G11C 7/06 | (2006.01) |
| G11C 7/10 | (2006.01) |
| G11C 7/12 | (2006.01) |
| G11C 7/08 | (2006.01) |
| G11C 7/14 | (2006.01) |
| G11C 7/22 | (2006.01) |

(52) U.S. Cl.
CPC .. G11C 7/08 (2013.01); G11C 7/06 (2013.01); G11C 7/12 (2013.01); G11C 7/14 (2013.01); G11C 7/227 (2013.01)

(58) Field of Classification Search
CPC .......... G11C 7/14; G11C 16/28; G11C 7/227; G11C 11/4099; G11C 7/08; G11C 7/06; G11C 7/12
USPC ....................... 365/210.1, 207, 189.05, 189.15
See application file for complete search history.

(56) References Cited

U.S. PATENT DOCUMENTS

| | | | |
|---|---|---|---|
| 5,022,009 A | | 6/1991 | Terada et al. |
| 5,134,588 A | * | 7/1992 | Kubota et al. ................. 365/207 |
| 6,556,472 B2 | * | 4/2003 | Yokozeki ....................... 365/154 |
| 6,678,198 B2 | * | 1/2004 | Issa et al. ...................... 365/207 |
| 7,486,565 B2 | * | 2/2009 | Edahiro ..................... 365/185.24 |
| 7,502,270 B2 | * | 3/2009 | Ohsawa ........................ 365/205 |
| 2006/0044794 A1 | | 3/2006 | Hatsuda et al. |
| 2011/0235440 A1 | * | 9/2011 | Watanabe ................. 365/189.07 |

(Continued)

FOREIGN PATENT DOCUMENTS

| | | |
|---|---|---|
| JP | 55-36479 U | 3/1980 |
| JP | 2-78099 A | 3/1990 |

(Continued)

OTHER PUBLICATIONS

Japanese Office Action mailed on Jan. 6, 2015 for corresponding Japanese Application No. 2011-205041.

*Primary Examiner* — Hoai V Ho
*Assistant Examiner* — Tri Hoang
(74) *Attorney, Agent, or Firm* — Arent Fox LLP

(57) ABSTRACT

A semiconductor memory device includes two memory cell arrays, a sense amplifier shared by the two memory cell arrays; and a control circuit configured to control data readout from the two memory cell arrays. Each memory cell array includes word lines, two or more bit lines, a dummy word line, memory cells provided at intersections of the bit lines and the word lines, and dummy cells provided at intersections of selected bit lines and the dummy word line. When the control circuit reads data from one memory cell array, the control circuit activates the dummy word line included in the other memory cell array and generates, with the dummy cell included in the other memory cell array, a reference level of the sense amplifier.

10 Claims, 20 Drawing Sheets

(56) References Cited

U.S. PATENT DOCUMENTS

2012/0026777 A1* 2/2012 Kitagawa et al. ............. 365/148
2012/0075912 A1* 3/2012 Hosono ........................ 365/148

FOREIGN PATENT DOCUMENTS

| JP | 7-78489 A | 3/1995 |
| JP | 2006-65901 A | 3/2006 |

* cited by examiner

Fig.18
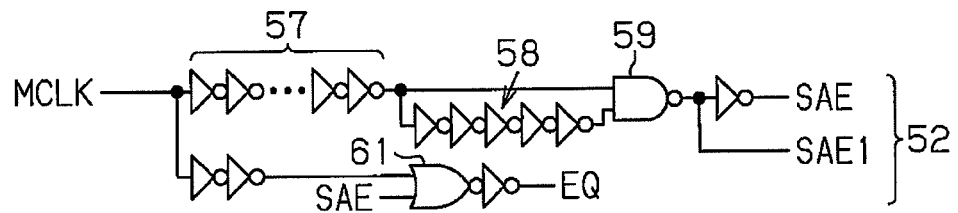
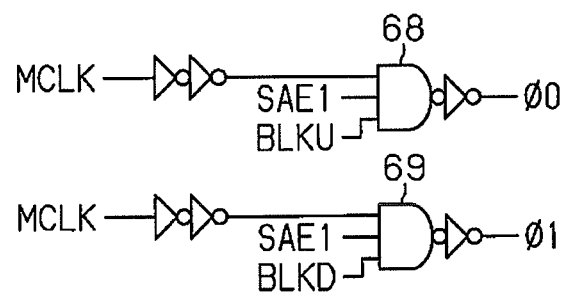

SEMICONDUCTOR MEMORY DEVICE AND DATA READING METHOD

CROSS-REFERENCE TO RELATED APPLICATIONS

This application is based upon and claims the benefit of priority from prior Japanese Patent Application No. 2011-205041, filed on Sep. 20, 2011, the entire contents of which are incorporated herein by reference.

FIELD

The present disclosure relates to a semiconductor memory device and a data reading method.

BACKGROUND ART

FIG. 23 illustrates a part of a read-only semiconductor memory device 110, which includes a memory cell array 111, a column switch 112, a reference level generation circuit 113 and a sense amplifier 114.

The memory cell array 111 includes a plurality (only one is illustrated in FIG. 23) word lines WL, a plurality of bit lines BL and a plurality of memory cells MC provided at intersections of the word lines WL and the bit lines BL. Each memory cell MC is a cell transistor T1 including a drain coupled to the corresponding bit line BL and a gate coupled to the corresponding word line WL.

The column switch 112 includes a plurality of switch circuits CS including first terminals coupled to the bit lines BL, respectively. A column selection signal COL is supplied to a gate of each switch circuit CS. A second terminal of each switch circuit CS is coupled to the sense amplifier 114 via a data bit line DB.

The reference level generation circuit 113 includes a dummy word line DWL, dummy bit lines DBL0, DBL1, one dummy cell DMCa provided in correspondence with the two dummy bit lines DBL0, DBL1 and N-channel MOS transistors TN. First terminals of the N-channel MOS transistors TN are respectively coupled to the dummy bit lines DBL0, DBL1. The dummy cell DMCa is a dummy transistor DTa including a drain coupled to the dummy bit lines DBL0 DBL1, a source coupled to a low-voltage power supply and a gate coupled to the dummy word line DWL. The transistor TN includes a gate coupled to a high-voltage power supply VDD and a second terminal coupled to a dummy common line DC.

In the case of reading data from an arbitrary memory cell MC of the semiconductor memory device 110, one word line WL and one bit line BL are activated. Data written in the memory cell MC coupled to the activated word line WL and bit line BL is read to the bit line BL. That is, the voltage of the bit line BL changes in accordance with the data written in the memory cell MC. The charge of the bit line BL is transmitted to the sense amplifier 114 through the data bit line DB in accordance with a column selection signal COL. At this time, in the reference level generation circuit 113, the dummy word line DWL and the dummy bit lines DBL0, DBL1 are activated and the dummy transistor DTa is turned on. The voltage of the dummy common line DC is changed by the turned-on dummy transistor DTa. The voltage of the dummy common line DC is supplied as a reference level to the sense amplifier 114. The sense amplifier 114 amplifies a voltage difference between the data bit line DB and the dummy common line DC and outputs an amplified signal as read data AX.

Since the reference level generation circuit 113 generates the reference level of the sense amplifier 114 in this way, the semiconductor memory device 110 may read data utilizing the sense amplifier 114 of a differential amplification type even in the case of reading the data of the memory cell MC by a single-phase bit line.

A technology relating to the above conventional technology is disclosed in Japanese Laid-Open Utility Model Publication No. 55-036479.

However, for the reference level generation circuit 113 to generate a desired reference level, the dummy bit lines DBL0, DBL1 need to be respectively formed to reproduce a load (parasitic capacity) of the bit line BL coupled to the memory cell MC. Thus, there is a problem of increasing a layout area by as much as the dummy bit lines DBL0, DBL1 are formed.

SUMMARY

According to an aspect of the embodiments, a semiconductor memory device includes two memory cell arrays, a sense amplifier shared by the two memory cell arrays, and a control circuit configured to control data readout from the two memory cell arrays. Each of the two memory cell arrays includes a plurality of word lines, n bit lines, where n is an integer not smaller than 2, a dummy word line, a plurality of memory cells provided at intersections of the bit lines and the plurality of word lines, and a dummy cell provided at an intersection of at least one bit line selected from the n bit lines and the dummy word line. When the control circuit reads data from one memory cell array of the two memory cell arrays, the control circuit activates the dummy word line included in the other memory cell array of the two memory cell arrays and generates, with the dummy cell included in the other memory cell array, a reference level of the sense amplifier.

The object and advantages of the invention will be realized and attained by means of the elements and combinations of particularly pointed out in the claims.

It is to be understood that both the foregoing general description and the following detailed description are exemplary and explanatory and are not restrictive of the invention.

BRIEF DESCRIPTION OF DRAWINGS

FIG. 18 is a block circuit diagram illustrating an internal configuration example of a controller of the third embodiment.

DESCRIPTION OF EMBODIMENTS

A first embodiment is described with reference to FIGS. 1 to 7.

Figure 1:
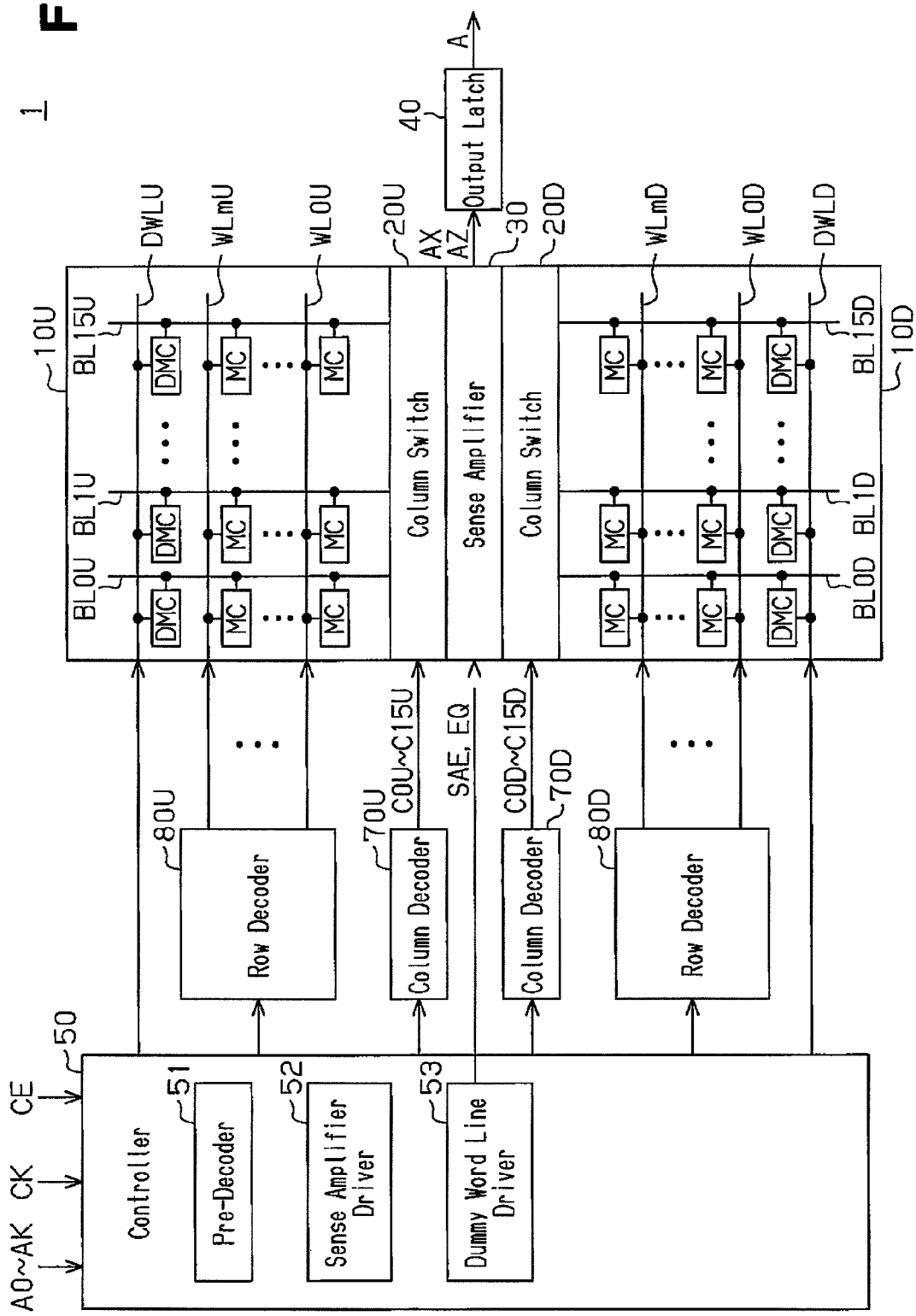
FIG. 1 is a block diagram illustrating a semiconductor memory device.

As illustrated in FIG. 1, the semiconductor memory device 1 includes memory cell arrays (cell arrays) 10U, 10D, column switches 20U, 20D, a sense amplifier 30, an output latch 40, a controller 50, column decoders 70U, 70D and row decoders 80U, 80D. The semiconductor memory device 1 is a read-only memory (ROM).

The cell array 10U and the column switch 20U are provided above the sense amplifier 30 in FIG. 1. On the other hand, the cell array 10D and the column switch 20D are provided below the sense amplifier 30 in FIG. 1. These two cell arrays 10U, 10D share the sense amplifier 30.

The cell array 10U includes a plurality of memory cells MC provided at intersections of a plurality of word lines WL0U to WLmU arranged side by side in a column direction (longitudinal direction in FIG. 1) and n (for example, 16) bit lines BL0U to BL15U arranged side by side in a row direction (horizontal direction in FIG. 1). Each word line WLU (generally indicating word lines WL0U to WLmU) is formed to extend in the row direction, and the memory cells MC arranged in the row direction are coupled to the common word line WLU. Each bit line BLU (generally indicating bit lines BL0U to BL15U) is formed to extend in the column direction, and the memory cells MC arranged in the column direction are coupled to the common bit line BLU. These memory cells MC are real cells in which desired data (cell information) is written.

The cell array 10U includes a plurality of dummy cells DMC provided at intersections of the above bit lines BLU and dummy word lines DWLU formed to extend in the row direction. These dummy cells DMC function as a reference level generation circuit that generates a reference level of the sense amplifier 30 when data is read from the other cell array 10D (when the cell array 10U is not accessed).

The column switch 20U selects one of the bit lines BL0U to BL15U and couples the selected bit line BLU with the sense amplifier 30 in accordance with a column selection signal C0U to C15U supplied from the column decoder 70U.

The cell array 10D includes a plurality of memory cells MC provided at intersections of the plurality of word lines WL0D to WLmD arranged side by side in the column direction and n (for example, 16) bit lines BL0D to BL15D arranged side by side in the row direction. Each word line WLD (generally indicating word lines WL0D to WLmD) is formed to extend in the row direction, and the memory cells MC arranged in the row direction are coupled to the common word line WLD. Each bit line BLD (generally indicating bit lines BL0D to BL15D) is formed to extend in the column direction, and the memory cells MC arranged in the column direction are coupled to the common bit line BLD. These memory cells MC are real cells in which desired data is written.

The cell array 10D includes a plurality of dummy cells DMC provided at intersections of the above bit lines BLD and dummy word lines DWLD formed to extend in the row direction. These dummy cells DMC function as a reference level generation circuit that generates a reference level of the sense amplifier 30 when data is read from the other cell array 10U (when the cell array 10D is not accessed).

The column switch 20D selects one of the bit lines BL0D to BL15D and couples the selected bit line BLD with the sense amplifier 30 in accordance with a column selection signal C0D to C15D supplied from the column decoder 70D.

For example, in reading data from the memory cell MC of the cell array 10U, one word line WLU is selected out of the plurality of word lines WL0U to WLmU and one bit line BLU is selected out of the plurality of bit lines BL0U to BL15U. Data written in the memory cell MC coupled to the selected word line WL and bit line BL is read to the sense amplifier 30. At this time, in the cell array 10D, the dummy word line DWLD is selected and all the bit lines BL0D to BL15D are selected. Then, the voltages of the bit lines BL0D to BL15D are changed by the dummy cells DMC and the changed voltages are provided to the sense amplifier 30. The voltages generated by the dummy cells DMC become the reference level of the sense amplifier 30.

The sense amplifier 30 is a sense amplifier of a differential amplification type. The sense amplifier 30 amplifies a difference voltage between a very small charge read from the cell array 10U and the reference level generated by the dummy cells DMC of the cell array 10D in reading data from the cell array 10U. On the other hand, the sense amplifier 30 amplifies a difference voltage between a very small charge read from the cell array 10D and the reference level generated by the dummy cells DMC of the cell array 10U in reading data from the cell array 10D. The sense amplifier 30 provides amplified signals AX, AZ to the output latch 40.

The output latch 40 latches the amplified signals AX, AZ provided from the sense amplifier 30 and provides the latched signals as output data A to the outside.

Address signals A0 to Ak, a clock signal CK and a chip enable signal CE are provided to the controller 50 from the outside. The controller 50 includes a pre-decoder 51, a sense amplifier driver 52 and a dummy word line driver 53. The pre-decoder 51 pre-decodes the address signals A0 to Ak and supplies the pre-decoded signals to the row decoders 80U, 80D and the column decoders 70U, 70D. Out of the address signals A0 to Ak, the address signals A0 to A3 are column address signals used to select the column switch, the address signals A4 to Ak−1 are row address signals used to select the word line, and the address signal Ak is an address signal used to select the cell array.

The sense amplifier driver 52 generates a sense amplifier enable signal SAE and an equalize signal EQ in accordance with the clock signal CK and the chip enable signal CE and provides the generated signals to the sense amplifier 30.

The dummy word line driver 53 selects (activates) any one of the dummy word lines DWLU, DWLD in accordance with the address signal Ak, the clock signal CK and the chip enable signal CE. Here, the dummy word line driver 53 causes the voltage of the selected dummy word line to transition from a voltage level (L level) of a low-voltage power supply (ground) to a voltage level (H level) of a high-voltage power supply VDD (see FIG. 2). Specifically, in reading data from one cell array 10U, the dummy word line driver 53 activates the dummy word lines DWLD of the other cell array 10D. On the other hand, the dummy word line driver 53 activates the dummy word lines DWLU of the cell array 10U in reading data from the cell array 10D.

The column decoder 70U decodes the pre-decoded signals to generate a column selection signal C0U to C15U and supplies the column selection signal C0U to C15U to the column switch 20U. In the column switch 20U, a predetermined bit line BLU is selected out of the bit lines BL0U to BL15U in accordance with the column selection signal C0U to C15U. Specifically, when the cell array 10U is accessed, any one bit line BLU of the bit lines BL0U to BL15U is selected. When the cell array 10D is accessed (when the cell array 10U is not accessed), all the bit lines BL0U to BL15U are selected.

The column decoder 70D decodes the pre-decoded signals to generate a column selection signal C0D to C15D and supplies the column selection signal C0D to C15D to the column switch 20D. In the column switch 20D, a predetermined bit line BLD is selected out of the bit lines BL0D to BL15D in accordance with the column selection signal C0D to C15D. Specifically, when the cell array 10D is accessed, any one bit line BLD of the bit lines BL0D to BL15D is selected. When the cell array 10U is accessed (when the cell array 10D is not accessed), all the bit lines BL0D to BL15D are selected.

The row decoder 80U decodes the pre-decoded signals and selects (activates) anyone word line WLU of the word lines WL0U to WLmU, i.e. pulls up the voltage of the predetermined word line WLU to H level. Specifically, the row decoder 80U selects any one word line WLU of the word lines WL0U to WLmU when data is read from the cell array 10U (when the cell array 10U is accessed). The row decoder 80U selects none of the word lines WL0U to WLmU when data is read from the cell array 10D, i.e. when the cell array 10U is not accessed.

The row decoder 80D decodes the pre-decoded signals and selects any one word line WLD of the word lines WL0D to WLmD, i.e. pulls up the voltage of the predetermined word line WLD to H level. Specifically, the row decoder 80D selects any one word line WLD of the word lines WL0D to WLmD when the cell array 10D is accessed. The row decoder 80D selects none of the word lines WL0D to WLmD when data is read from the cell array 10U, i.e. when the cell array 10D is not accessed.

Figure 2:
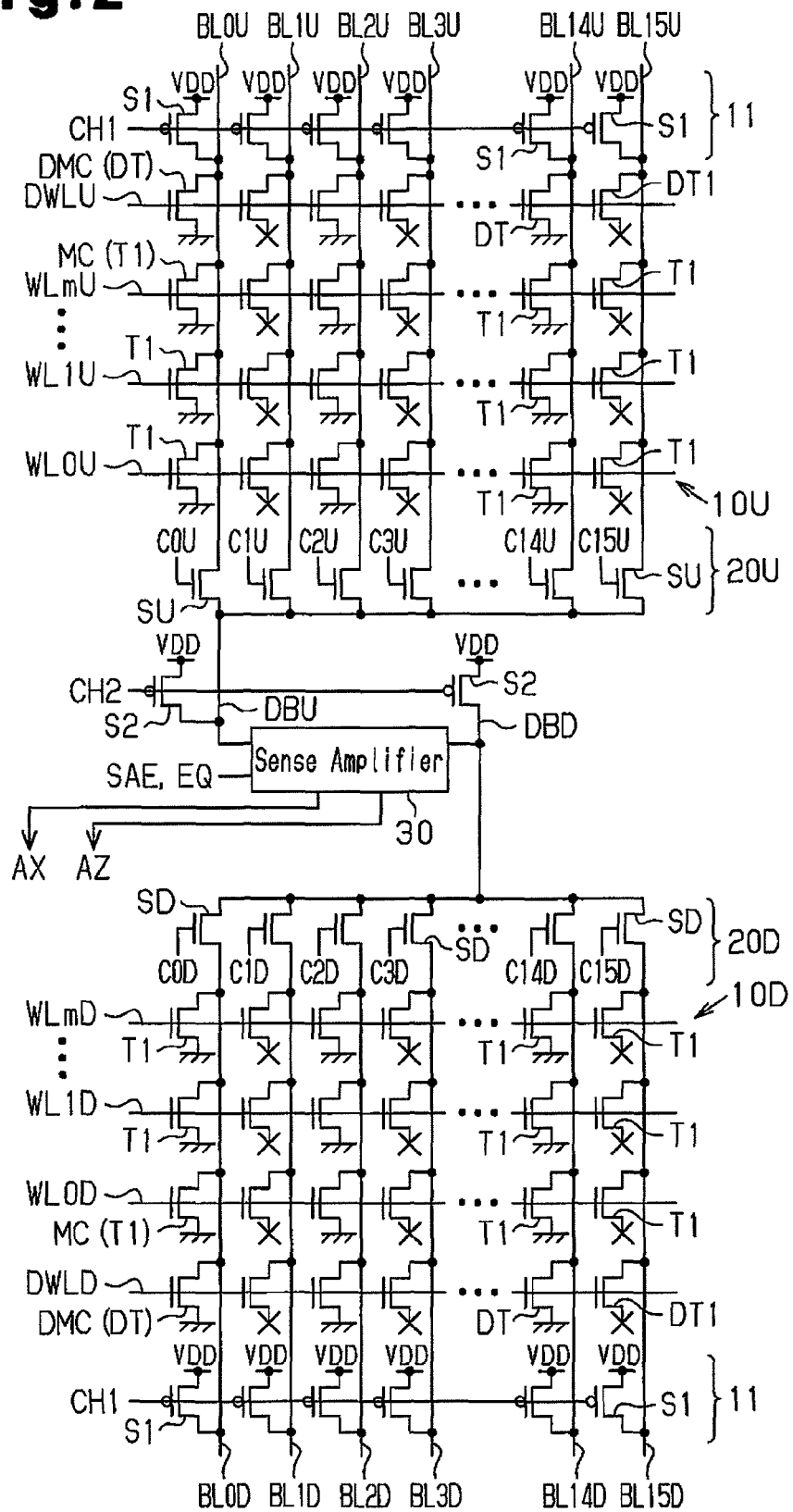
FIG. 2 is a circuit diagram of a cell array and a column switch of a first embodiment.

Next, internal configuration examples of the cell arrays 10U, 10D and the column switches 20U, 20D are described with reference to FIG. 2.

The cell array 10U includes a precharge circuit 11 for precharging each bit line BLU, the memory cells MC provided at the intersections of the word lines WLU and the bit lines BLU, and the dummy cells DMC provided at the intersections of the dummy word lines DWLU and the bit lines BLU.

The precharge circuit 11 is provided to correspond to each bit line BL0U to BL15U and includes a plurality of switch circuits S1 for coupling each bit line BL0U to BL15U with the high-voltage power supply VDD. Each switch circuit S1 is, for example, a P-channel MOS transistor. A source of each switch circuit S1 is coupled to the high-voltage power supply VDD and a drain thereof is coupled to the corresponding bit line BLU. A precharge signal CH1 is supplied to a gate of each switch circuit S1. These switch circuits S1 are turned on in response to a precharge signal CH1 of L level supplied before the selection of the word line WLU and the bit line BLU. When the switch circuits S1 are turned on, each bit line BL0U to BL15U is coupled to the high-voltage power supply VDD. That is, the precharge circuit 11 precharges all the bit lines BL0U to BL15U to a voltage level (H level) of the high-voltage power supply VDD while the precharge signal CH1 is at L level.

Each memory cell MC includes one cell transistor T1. The cell transistor T1 is, for example, an N-channel MOS transistor. A drain of the cell transistor T1 storing data of "0" is coupled to the corresponding bit line BLU, a source thereof is coupled to the low-voltage power supply (ground) and a gate thereof is coupled to the corresponding word line WLU. Thus, when the word line WLU is selected and the cell transistor T1 is turned on, the bit line BLU is set to a ground level (L level) and the data of "0" is read. On the other hand, a drain of the cell transistor T1 storing data of "1" is coupled to the corresponding bit line BLU, a source thereof is set to an open state and a gate thereof is coupled to the corresponding word line WLU. Thus, when the word line WLU is selected and the cell transistor T1 is turned on, the bit line BLU is set to a precharge level (H level) and the data of "1" is read.

Each dummy cell DMC includes one dummy transistor DT. The dummy transistor DT is, for example, an N-channel MOS transistor. The dummy transistor DT has the same electrical properties as the above cell transistor T1. That is, the dummy transistor DT is a replica transistor which is a replica of the cell transistor T1. A drain of the dummy transistor DT is coupled to the corresponding bit line BLU, a source thereof is coupled to the ground, and a gate thereof is coupled to the dummy word line DWLU. A transistor DT1 whose drain is coupled to the corresponding bit line BLU, whose source is set to an open state and whose gate is coupled to the dummy word line DWLU is provided in one of the two bit lines BLU. The transistor DT1 does not function as the dummy cell DMC (dummy transistor DT). That is, the dummy transistors DT (dummy cells DMC) are provided for n/2 bit lines BLU out of the n bit lines BLU. In other words, the sources of the n/2 dummy transistors DT out of the n transistors respectively coupled to the dummy word lines DWLU and the n bit lines BLU are coupled to the ground, and the sources of the remaining n/2 transistors DT1 are set to the open state. Thus, when the dummy word line DWLU is selected, one dummy transistor DT is provided for two bit lines BLU (e.g. bit lines BL0U, BL1U). By this, a load (parasitic capacity) of the bit line BLU on one dummy transistor DT is about twice the load of the bit line BLU on one cell transistor T1. Accordingly, a time constant in a voltage change of the bit line BLU when the dummy word line DWLU is selected is about twice the time constant when data is read from the memory cell MC. As a result, the voltage of each bit line BLU when the dummy word line DWLU is selected is set at an intermediate voltage between a voltage when data of "0" is read from the memory cell MC and a voltage when data of "1" is read. Such an intermediate voltage generated by the dummy transistor DT is utilized as a reference level in the sense amplifier 30.

The column switch 20U includes a plurality of column switches SU provided in correspondence with the respective bit lines BL0U to BL15U. The column switch SU is, for example, an N-channel MOS transistor. A first terminal (e.g. drain) of each column switch SU is coupled to the bit line BLU and a second terminal (e.g. source) thereof is coupled to a data bit line DBU. The column selection signals C0U to C15U are respectively supplied to gates of the column switches SU corresponding to the respective bit lines BL0U to BL15U. These column switches SU are turned on in response to column selection signals C0U to C15U of H level. When the column switch SU is turned on, the bit line BLU corresponding to that column switch SU and the data bit line DBU are coupled. Since all the column selection signals C0U to C15U become H level when the cell array 10D is accessed, all the column switches SU are turned on and all the bit lines BL0U to BL15U are commonly coupled to the data bit line DBU.

The data bit line DBU is coupled to the sense amplifier 30. A switch circuit S2 for precharging is coupled to the data bit line DBU. The switch circuit S2 is, for example, a P-channel MOS transistor. A drain of the switch circuit S2 is coupled to the data bit line DBU and a source thereof is coupled to the high-voltage power supply VDD. A precharge signal CH2 is supplied to a gate of the switch circuit S2. The switch circuit S2 is turned on in response to a precharge signal CH2 of L level supplied before the selection of the word line WLU and the bit line BLU. Since the high-voltage power supply VDD is coupled to the data bit line DBU when the switch circuit S2 is turned on, the data bit line DBU is precharged to H level.

The cell array 10D and the column switch 20D respectively have substantially the same configurations as the cell array 10U and the column switch 20U. Thus, similar elements are denoted by the same reference signs or by replacing "U" at the ends of the reference signs of the elements of the cell array 10U and the column switch 20U by "D", and each element is not described in detail.

Figure 3:
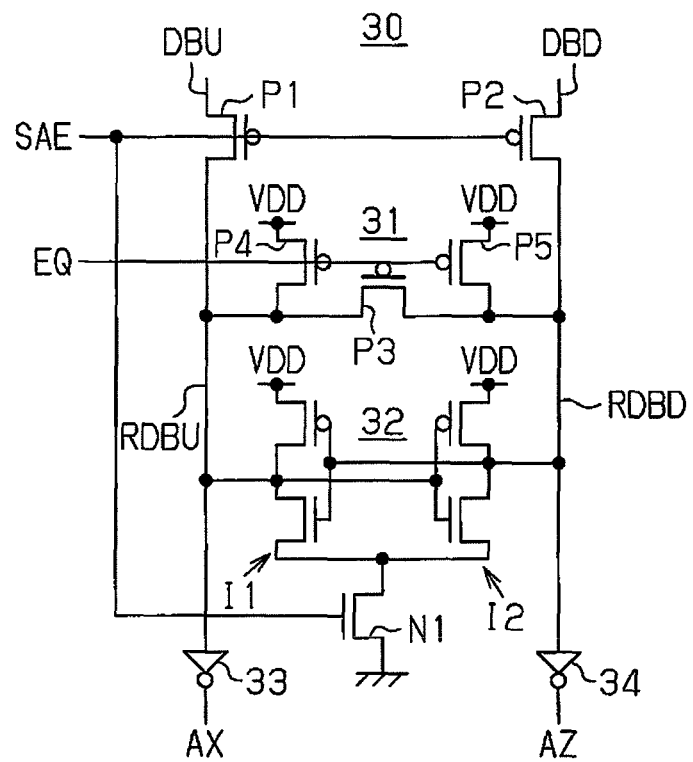
FIG. 3 is a circuit diagram of a sense amplifier of the first embodiment.

Next, an internal configuration example of the sense amplifier 30 is described with reference to FIG. 3.

The sense amplifier 30 includes P-channel MOS transistors P1, P2 for respectively coupling data bit lines DBU, DBD with read bit lines RDBU, RDBD, a precharge circuit 31, a sense amplifier unit 32, and inverter circuits 33, 34 respectively coupled to the read bit lines RDBU, RDBD.

A sense amplifier enable signal SAE is supplied to gates of the transistors P1, P2. These transistors P1, P2 are turned on in response to a sense amplifier enable signal SAE of L level and respectively connect the data bit lines DBU, DBD and the read bit lines RDBU, RDBD. These transistors P1, P2 make the capacities of the data bit lines DBU, DBD unseen from the sense amplifier unit 32 by separating the read bit lines RDBU, RDBD coupled to the sense amplifier unit 32 from the data bit lines DBU, DBD coupled to the memory cells MC.

The precharge circuit 31 includes a P-channel MOS transistor P3 coupled between the read bit lines RDBU and RDBD, a P-channel MOS transistor P4 coupled to the read bit line RDBU, and a P-channel MOS transistor P5 coupled to the read bit line RDBD. A source of the transistor P4 is coupled to the high-voltage power supply VDD and a drain thereof is coupled to the read bit line RDBU. A source of the transistor P5 is coupled to the high-voltage power supply VDD and a drain thereof is coupled to the read bit line RDBD. An equalize signal EQ is supplied to gates of the transistors P3, P4 and P5. These transistors P3, P4 and P5 are turned on in response to an equalize signal of L level supplied before the selection of the word line WLU and the bit line BLU. That is, the precharge circuit 31 precharges the read bit lines RDBU, RDBD to H level while the equalize signal EQ is at L level.

The sense amplifier unit 32 includes a pair of CMOS inverters I1, I2 whose inputs and outputs are coupled to each other and an N-channel MOS transistor N1 provided between the CMOS inverters I1, I2 and the ground. The output of the CMOS inverter I1 is coupled to the input of the CMOS inverter I2 and the read bit line RDBU. The output of the CMOS inverter I2 is coupled to the input of the CMOS inverter I1 and the read bit line RDBD. The CMOS inverters I1, I2 are coupled to the high-voltage power supply VDD and coupled to the ground via the transistor N1. A sense amplifier enable signal SAE is supplied to a gate of the transistor N1. The transistor N1 is turned on in response to a sense amplifier enable signal of H level. That is, the sense amplifier unit 32 is activated in response to a sense amplifier enable signal SAE of H level and amplifies a voltage difference between the read bit lines RDBU, RDBD to the high-voltage power supply VDD level (H level) and the ground level (L level).

Figure 4:
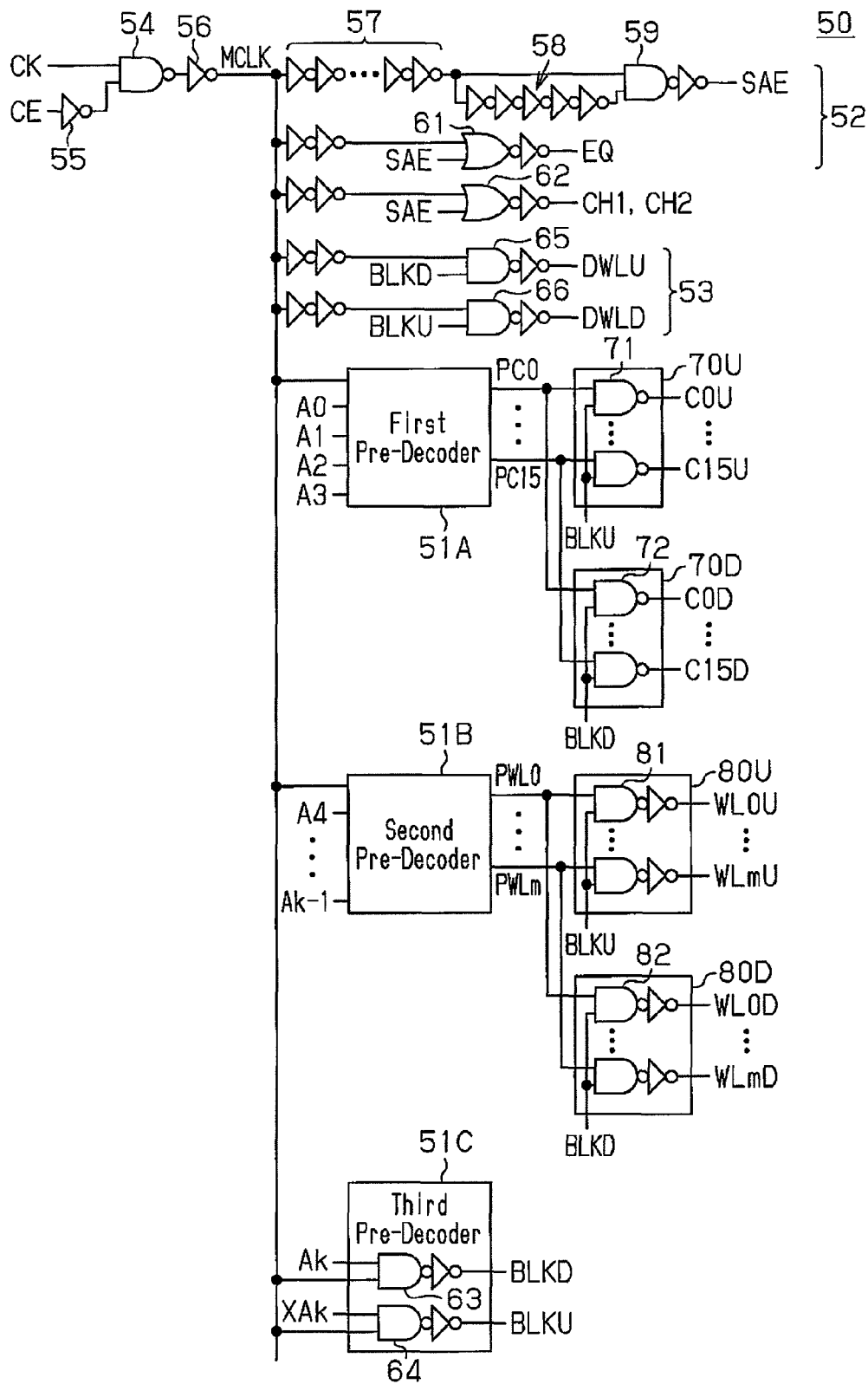
FIG. 4 is a circuit diagram of a controller of the first embodiment.

Next, an internal configuration example of the controller 50 is described with reference to FIG. 4.

In the controller 50, a clock signal CK is provided to an NAND circuit 54 and a chip enable signal CE is provided to the NAND circuit 54 via an inverter circuit 55. An output signal of the NAND circuit 54 is output as a clock signal MCLK via an inverter circuit 56 in an odd-numbered stage (first stage in FIG. 4). When the clock signal CK transitions to H level with the chip enable signal CE kept at L level, the clock signal MCLK becomes H level after an operation delay time of the inverter circuit 56 from that transition. The clock signal MCLK is supplied to the sense amplifier driver 52, the dummy word line driver 53 and first to third pre-decoders 51A to 51C.

In the sense amplifier driver 52, the clock signal MCLK is provided to an inverter circuit 57 in an even-numbered stage. An output signal of the inverter circuit 57 is supplied to an NAND circuit 59 via an inverter circuit 58 in an odd-numbered stage (fifth stage in FIG. 4) as well as directly supplied to the NAND circuit 59. An output signal of the NAND circuit 59 is output as the above sense amplifier enable signal SAE via an inverter circuit. An operation delay time of the inverter circuit 57 in the odd-numbered stage is equivalent to a waiting time until the sense amplifier 30 is activated after the chip enable signal CE transitions to L level and the clock signal MCLK rises to H level. An operation delay time of the inverter circuit 58 in the odd-numbered stage is equivalent to the pulse width of the sense amplifier enable signal SAE.

In the sense amplifier driver 52, the clock signal MCLK delayed by a predetermined time by an inverter circuit in an even-numbered stage is provided to a NOR circuit 61, and the sense amplifier enable signal SAE is provided to the NOR circuit 61. An output signal of the NOR circuit 61 is output as the above equalize signal EQ via an inverter circuit.

In the controller 50, the clock signal MCLK delayed by a predetermined time by an inverter circuit in an even-numbered stage is provided to a NOR circuit 62, and the sense amplifier enable signal SAE is provided to the NOR circuit 62. An output signal of the NOR circuit 62 is output as the above precharge signal CH1, CH2 via an inverter circuit.

The above clock signal MCLK and the column address signals A0 to A3 composed of lower four bits of the address signals A0 to Ak are provided to the first pre-decoder 51A. The first pre-decoder 51A operates in accordance with the clock signal MCLK of H level and generates pre-decoded signals PC0 to PC15 in accordance with the column address signals A0 to A3 and their inverted signals. Specifically, in the first pre-decoder 51A, any one of the pre-decoded signals PC0 to PC15 becomes L level in accordance with the column address signals A0 to A3.

The above clock signal MCLK and the row address signals A4 to Ak−1 out of the address signals A0 to Ak are provided to the second pre-decoder 51B. The second pre-decoder 51B operates in accordance with the clock signal MCLK of H level and generates pre-decoded signals PWL0 to PWLm in accordance with the row address signals A4 to Ak−1 and their inverted signals. Specifically, in the second pre-decoder 51B, any one of the pre-decoded signals PWL0 to PWLm becomes H level in accordance with the row address signals A4 to Ak−1.

The above clock signal MCLK, the address signal Ak composed of the highest-order bit of the address signals A0 to Ak and an inverted signal XAk of the address signal Ak are provided to the third pre-decoder 51C. In the third pre-decoder 51C, the clock signal MCLK is provided to the NAND circuits 63, 64 and the address signal Ak and the inverted signal XAk are respectively provided to the NAND circuits 63, 64. An output signal of the NAND circuit 63 is output as a selection signal BLKD via an inverter circuit. An output signal of the NAND circuit 64 is output as a selection signal BLKU via an inverter circuit. In the third pre-decoder 51C, either one of the selection signals BLKU, BLKD becomes H level in accordance with the address signal Ak. Specifically, the selection signal BLKU becomes H level in reading data from the cell array 10U and the selection signal BLKD becomes H level in reading data from the cell array 10D.

In the dummy word line driver 53, the clock signal MCLK delayed by the predetermined time by the inverter circuit in the even-numbered stage is provided to NAND circuits 65, 66. The above selection signal BLKD is provided to the NAND circuit 65. An output signal of the NAND circuit 65 is provided to the dummy word line DWLU via an inverter circuit. That is, an inversion level of the output signal of the NAND circuit 65 becomes the voltage of the dummy word line DWLU. For example, when the cell array 10U is accessed, i.e. when the selection signal BLKD is at L level, the output signal of the NAND circuit 65 is at H level regardless of the signal level of the clock signal MCLK. Thus, the voltage of the dummy word line DWLU becomes L level. On the other hand, when the cell array 10D is accessed, i.e. when the selection signal BLKD is at H level, the output signal of the NAND circuit 65 becomes L level in response to the rise of the clock signal MCLK, wherefore the voltage of the dummy word line DWLU becomes H level.

The above selection signal BLKU is provided to the NAND circuit 66. An output signal of the NAND circuit 66 is provided to the dummy word line DWLD via an inverter circuit. That is, an inversion level of the output signal of the NAND circuit 66 becomes the voltage of the dummy word line DWLD. For example, when the cell array 10D is accessed, i.e. when the selection signal BLKU is at L level, the output signal of the NAND circuit 66 is at H level regardless of the signal level of the clock signal MCLK. Thus, the voltage of the dummy word line DWLD becomes L level. On the other hand, when the cell array 10U is accessed, i.e. when the selection signal BLKU is at H level, the output signal of the NAND circuit 66 becomes L level in response to the rise of the clock signal MCLK, wherefore the voltage of the dummy word line DWLD becomes H level.

Next, internal configuration examples of the column decoders 70U, 70D are described.

The column decoder 70U includes sixteen NAND circuits 71 to which the pre-decoded signals PC0 to PC15 provided from the first pre-decoder 51A are respectively provided. The selection signal BLKU is provided to each NAND circuit 71. Output signals of the NAND circuits 71 are provided as column selection signals C0U to C15U to the corresponding column switches SU (see FIG. 2). For example, when the cell array 10U is accessed, i.e. when the selection signal BLKU is at H level, anyone of the column selection signals C0U to C15U becomes H level in accordance with the pre-decoded signals PC0 to PC15. On the other hand, when the cell array 10D is accessed, i.e. when the selection signal BLKU is at L level, all the column selection signals C0U to C15U become H level. By this, all the column switches SU coupled to the bit lines BL0U to BL15U are turned on.

The column decoder 70D includes sixteen NAND circuits 72 to which the pre-decoded signals PC0 to PC15 provided from the first pre-decoder 51A are respectively provided. The selection signal BLKD is provided to each NAND circuit 72. Output signals of the NAND circuits 72 are supplied as column selection signals C0D to C15D to the corresponding column switches SD (see FIG. 2).

Next, internal configuration examples of the row decoders 80U, 80D are described.

The row decoder 80U includes a plurality of NAND circuits 81 to which the pre-decoded signals PWL0 to PWLm provided from the second pre-decoder 51B are respectively provided. The selection signal BLKU is provided to each NAND circuit 81. Output signals of the plurality of NAND circuits 81 are respectively provided to the corresponding word lines WL0U to WLmU via inverter circuits. That is, inversion levels of the output signals of the NAND circuits 81 become the voltages of the word lines WL0U to WLmU. For example, when the cell array 10U is accessed, i.e. the selection signal BLKU is at H level, any one word line WLU of the word lines WL0U to WLmU becomes H level in accordance with the pre-decoded signals PWL0 to PWL15. On the other hand, when the cell array 10D is accessed, i.e. the selection signal BLKU is at L level, the output signals of all the NAND circuits 81 become H level. Thus, the voltages of all the word lines WL0U to WLmU are at L level. The number of the NAND circuits 81 may be equal to that of the word lines WL0U to WLmU.

The row decoder 80D includes a plurality of NAND circuits 82 to which the pre-decoded signals PWL0 to PWLm provided from the second pre-decoder 51B are respectively provided. The selection signal BLKD is provided to each NAND circuit 82. Output signals of the plurality of NAND circuits 82 are respectively provided to the corresponding word lines WL0D to WLmD via inverter circuits. That is, inversion levels of the output signals of the NAND circuits 82 become the voltages of the word lines WL0D to WLmD. The number of the NAND circuits 82 may be equal to that of the word lines WL0D to WLmD.

In the first embodiment, the precharge circuit 11 is an example of a first precharge circuit, the switch circuit S2 is an example of a second precharge circuit, the controller 50 is an example of a control circuit and the data bit lines DBU, DBD are an example of a common bit line.

Figure 5:
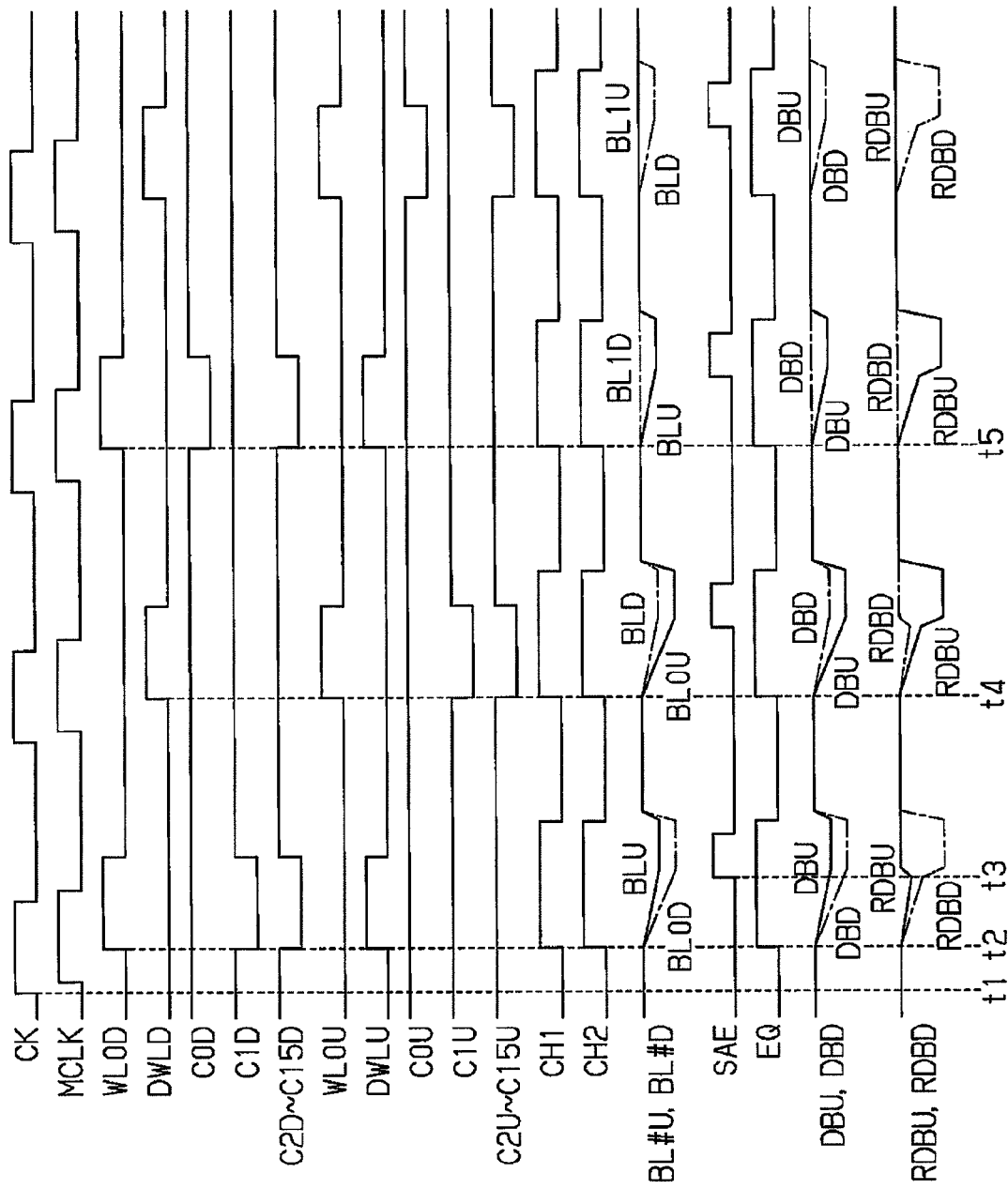
FIG. 5 is a timing chart illustrating the operation of the semiconductor memory device of the first embodiment.

Next, the operation of the above semiconductor memory device 1 is described also with reference to FIG. 5. "#" in the bit lines BL#U, BL#D of FIG. 5 indicates the bit line selected in accordance with the address signals A0 to Ak illustrated in FIG. 2 (specifically, column address signals A0 to A3). In FIG. 5, a vertical axis and a horizontal axis are illustrated on an enlarged or reduced scale as appropriate to simplify description.

First, an operation in the case of reading data "0" from the memory cell MC of the cell array 10D is described. Specifically, an operation when the address signals A0 to Ak are provided to select the memory cell MC coupled to the bit line BL0D and the word line WL0D of the cell array 10D is described.

Precharging Operation

If a clock signal CK rises to H level (time t1) when a chip enable signal CE is at L level, a clock signal MCLK rises to H level after the elapse of a predetermined time from that rise. At this time, a precharging operation is performed before data readout from the cell array 10D is started. Specifically, column selection signals C0U to C15U of H level are provided from the column decoder 70U and column selection signals C0D to C15D of H level are provided from the column decoder 70D. By this, all the column switches SU of the cell array 10U are turned on and all the bit lines BL0U to BL15U are commonly coupled to the data bit line DBU. All the column switches SD of the cell array 10D are turned on and all the bit lines BL0D to BL15D are commonly coupled to the data bit line DBD. Further, precharge signals CH1, CH2 of L level, an equalize signal EQ of L level and a sense amplifier enable signal SAE of L level are provided from the controller 50. The switch circuits S1, S2 are turned on in response to these precharge signals CH1, CH2 of L level, and the bit lines BL0U to BL15U, the bit lines BL0D to BL15D and the data bit lines DBU, DBD are precharged to H level. Further, the precharge circuit 31 is activated in response to the above equalize signal EQ of L level and the read bit lines RDBU, RDBD are precharged to H level. Since the transistors P1, P2 are turned on in response to the sense amplifier enable signal SAE of L level, the data bit lines DBU, DBD are respectively coupled to the read bit lines RDBU, RDBD of the sense amplifier 30. At this time, the sense amplifier 30 is inactivated by the sense amplifier enable signal SAE of L level.

Reading Operation

First, when the precharge signal CH1, CH2 and the equalize signal EQ transition from L level to H level in response to the above clock signal MCLK of H level, the precharging operation is finished and a transition is made to a reading operation (time t2). That is, the switch circuits S1, S2 are turned off in response to the precharge signals CH1, CH2 of H level, and the flow of a current from the high-voltage power supply VDD into the bit lines BLU, BLD and the data bit lines DBU, DBD is interrupted. The precharge circuit 31 is inactivated in response to the equalize signal EQ of H level and the flow of a current from the high-voltage power supply VDD into the read bit lines RDBU, RDBD is interrupted.

The first to third pre-decoders 51A to 51C operate in accordance with the above clock signal MCLK of H level, and pre-decoded signals PC0 to PC15, pre-decoded signals PWL0 to PWLm and selection signals BLKU, BLKD are generated. Then, the row decoder 80D provides a signal of H level to the word line WL0D and a signal of L level to the word lines WL1D to WLmD in accordance with the pre-decoded signals PWL0 to PWLm and the selection signal BLKD. By this, the cell transistors T1 coupled to the word line WL0D are turned on in the cell array 10D. The column decoder 70D provides a column selection signal C0D of H level and column selection signals C1D to C15D of L level to the column switch SD in accordance with the pre-decoded signals PC0 to PC15 and the selection signal BLKD. Since this causes only the column switch SD coupled to the bit line BL0D to be turned on, only the bit line BL0D is coupled to the read bit line RDBD of the sense amplifier 30 via the data bit line DBD. At this time, since the bit line BL0D is coupled to the ground via the turned-on cell transistor T1, a load of the bit line BL0D is discharged via the cell transistor T1. As a result, the voltage of the bit line BL0D is gradually reduced. Further, since the charge of the bit line BL0D is transferred to the data bit line DBD and the read bit line RDBD, the voltages of the data bit line DBD and the read bit line RDBD are also gradually reduced similar to the voltage of the bit line BL0D.

On the other hand, the row decoder 80U provides a signal of L level to all the word lines WL0U to WLmU in accordance with the selection signal BLKU of L level. By this, all the memory cells MC are turned off in the cell array 10U. At this time, the dummy word line driver 53 in the controller 50 provides a signal of H level to the dummy word lines DWLU in accordance with the above selection signal BLKU of L level. By this, all the dummy transistors DT are turned on in the cell array 10U.

At this time, the above column decoder 70U provides the column selection signals C0U to C15U of H level to the column switches SU in accordance with the selection signal BLKU of L level. Since this causes all the column switches SU to be turned on, all the bit lines BL0U to BL15U are commonly coupled to the read bit line RDBU of the sense amplifier 30 via the data bit line DBU. Then, the charges of the bit lines BL0 to BL15U are discharged via the turned-on dummy transistors DT since the bit lines BL0U to BL15U are coupled to the ground via the dummy transistors DT. As a result, the voltages of the bit lines BL0U to BL15U are gradually reduced. For example, in the cell array 10U, one dummy transistor DT is coupled to the ground for two bit lines BLU (e.g. bit lines BL0U, BL1U). Thus, a load of the bit line BLU on the dummy transistor DT is about twice that of the bit line BL0D on the cell transistor T1 of the cell array 10D. Accordingly, the voltage of the read bit line RDBU is more moderately reduced than that of the read bit line RDBD. Specifically, the voltage of the read bit line RDBU is an intermediate voltage between a voltage in reading data "0" from the memory cell MC and a voltage in reading data "1". As a result, the voltage read from the cell transistor T1 and the voltage generated by the dummy transistor DT differ, whereby there is a voltage difference between the read bit lines RDBU and RDBD.

Consequently, when the sense amplifier enable signal SAE rises (time t3), the sense amplifier 30 is activated in response to the sense amplifier enable signal SAE of H level and a very small voltage difference between the read bit lines RDBU and RDBD is amplified. By this, the read bit lines RDBU, RDBD respectively complementarily transition to H level and L level. Here, the read bit line RDBU transitions to H level and the read bit line RDBD transitions to L level. Output data A having the same logic as that on the read bit line RDBU (logic opposite to data logic on the read bit line RDBD). Here output data A of H level is provided from the output latch 40. In this way, the data "0" written in the memory cell MC coupled to the bit line BL0D and the word line WL0D may be read.

Next, an operation of reading data "0" from the memory cell MC of the cell array 10U is briefly described. Specifically, an operation when the address signals A0 to Ak are provided to select the memory cell MC coupled to the bit line BL0U and the word line WL0U of the cell array 10U is described.

Similarly to the above, a reading operation is started after the precharging operation. At this time, in the cell array 10U, the voltage of the word line WL0U rises to H level and the bit line BL0U is selected in response to the column selection signal C0U of H level (time t4). Then, the bit line BL0U is discharged via the cell transistor T1 coupled to these word line WL0U and bit line BL0U, whereby the voltage of the bit line BL0U is reduced. Associated with this, the voltages of the data bit line DBU and the read bit line RDBU are also reduced.

On the other hand, in the cell array 10D, the voltages of the dummy word lines DWLD rise to H level and the bit lines BL0D to BL15D are selected in response to the column selection signals C0D to C15D of H level. Then, all the dummy transistors DT of the cell array 10D are turned on and the voltage of the read bit line RDBD is set to the intermediate voltage by the dummy transistors DT. This causes a voltage difference between the read bit lines RDBU and RDBD.

Thereafter, a very small voltage difference between the read bit lines RDBU, RDBD is amplified by the sense amplifier 30 activated in response to the sense amplifier enable signal SAE of H level. This causes the read bit line RDBU to transition to L level and the read bit line RDBD to transition to H level. Output data A of L level having the same logic as the data logic on the read bit line RDBU is provided from the output latch 40. In this way, the data "0" written in the memory cell MC coupled to the bit line BL0U and the word line WL0U may be read.

Next, an operation of reading data "1" from the memory cell MC of the cell array 10D is described. Specifically, an operation when the address signals A0 to Ak are provided to select the memory cell MC coupled to the bit line BL1D and the word line WL0D of the cell array 10D is described.

Similarly to the above, a reading operation is started after the precharging operation. At this time, in the cell array 10D, the voltage of the word line WL0D rises to H level and the bit line BL1D is selected in response to the column selection signal C1D of H level. Then, the cell transistor T1 coupled to these word line WL0D and bit line BL1D is selected. Since the source of that cell transistor T1 is in the open state, the voltage of the bit line BL1D is kept at H level (precharge level).

On the other hand, in the cell array 10U, the voltages of the dummy word lines DWLU rise to H level and all the bit lines BL0U to BL15U are selected in response to the column selection signals C0U to C15U of H level. Then, all the dummy transistors DT of the cell array 10U are turned on and the voltage of the read bit line RDBU is set to the intermediate voltage by the dummy transistors DT. This causes a voltage difference between the read bit lines RDBU and RDBD.

Thereafter, a very small voltage difference between the read bit lines RDBU, RDBD is amplified by the sense amplifier 30 activated in response to the sense amplifier enable signal SAE of H level. This causes the read bit line RDBU to transition to L level and the read bit line RDBD to transition to H level. Output data A of L level having the same logic as the data logic on the read bit line RDBU (logic opposite to the logic on the read bit line RDBD) is provided from the output latch 40. In this way, the data "1" written in the memory cell MC coupled to the bit line BL1D and the word line WL0D may be read.

According to the first embodiment, the following effects may be achieved.

(1) In reading data from one cell array (e.g. cell array 10U), the reference level of the sense amplifier 30 is generated by the dummy cells DMC provided in the other cell array (e.g. cell array 10D), i.e. the cell array that is not accessed. The dummy cells DMC are coupled to the bit lines BLU, BLD coupled to the memory cells MC (real cells). That is, the bit lines BLU, BLD are shared by the memory cells MC and the dummy cells DMC. This may reduce the layout area as compared with the case where bit lines different from those for the memory cells MC are formed for the reference level generation circuit (here, dummy cells DMC).

Figure 6:
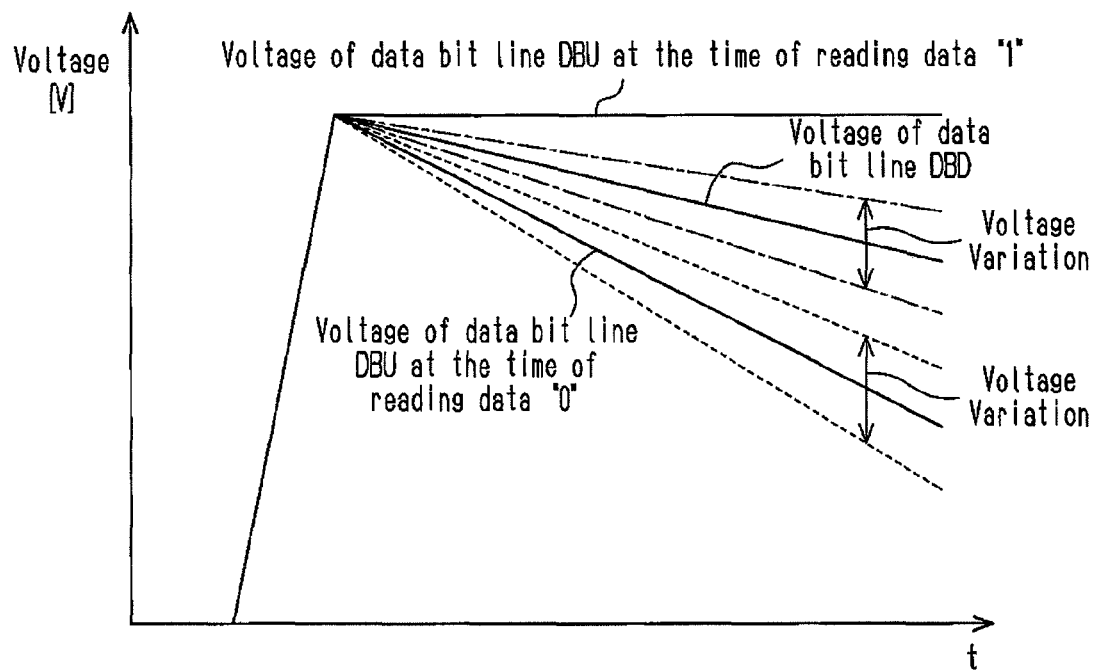
FIG. 6 is a graph illustrating voltage variations of data bit lines.

(2) For example, due to variations and the like of a manufacturing process and a manufacturing line for semiconductor integrated circuits, on-resistances, threshold voltages and transistor sizes of the cell transistors T1 and the dummy transistors DT may vary and a voltage amplitude of bit lines may vary with time. For example, as illustrated in FIG. 6, voltage drops of the data bit lines DBU of the cell array to be accessed (e.g. cell array 10U) and voltage drops of the data bit lines DBD of the cell array not to be accessed (e.g. cell array 10D) vary. Due to the variation, there is a problem of being unable to normally read data when the voltage of the data bit line DBD becomes lower than the voltage of the data bit line DBU at the time of reading the data "0".

Figure 7:
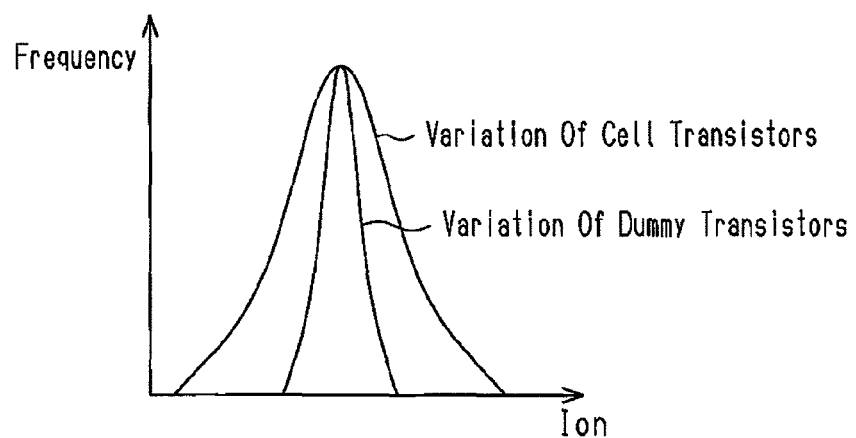
FIG. 7 is a graph illustrating variations of transistors.

Contrary to this, in the first embodiment, a plurality of (eight, for example) dummy cells DMC (reference level generation circuit) are operated in generating the reference level of the sense amplifier 30. Since the variations of the dummy transistors DT are averaged by this, the variation of (ON-currents Ion of) the dummy transistors DT may be made smaller than that of the cell transistors T1 as illustrated in FIG. 7. Thus, an influence caused by transistor manufacturing variations may be reduced and the reference level of the sense amplifier 30 may be set at a desired level. Thus, the occurrence of a problem that the voltage of the data bit line DBD generated by the dummy cells DMC as described above becoming lower than the voltage of the data bit line DBU at the time of reading the data "0" may be preferably suppressed.

Further, since the bit lines BLU, BLD coupled to the memory cells MC are shared by all of the plurality of dummy cells DMC at this time, an increase in the layout area may be effectively suppressed.

Modification of the First Embodiment

The first embodiment may also be changed as follows.

Figure 8:
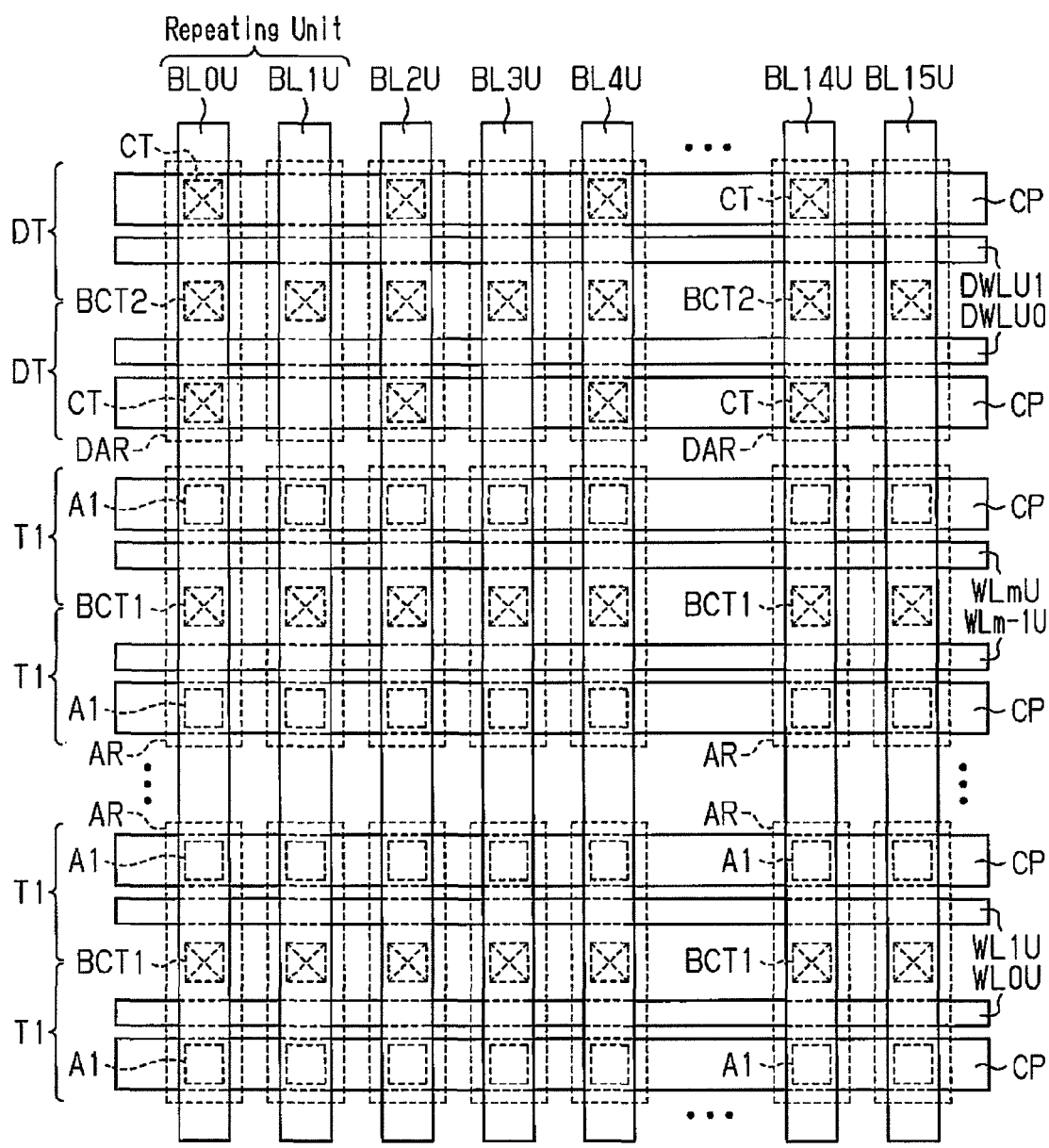
FIG. 8 is a layout diagram of the cell array.
Figure 9:
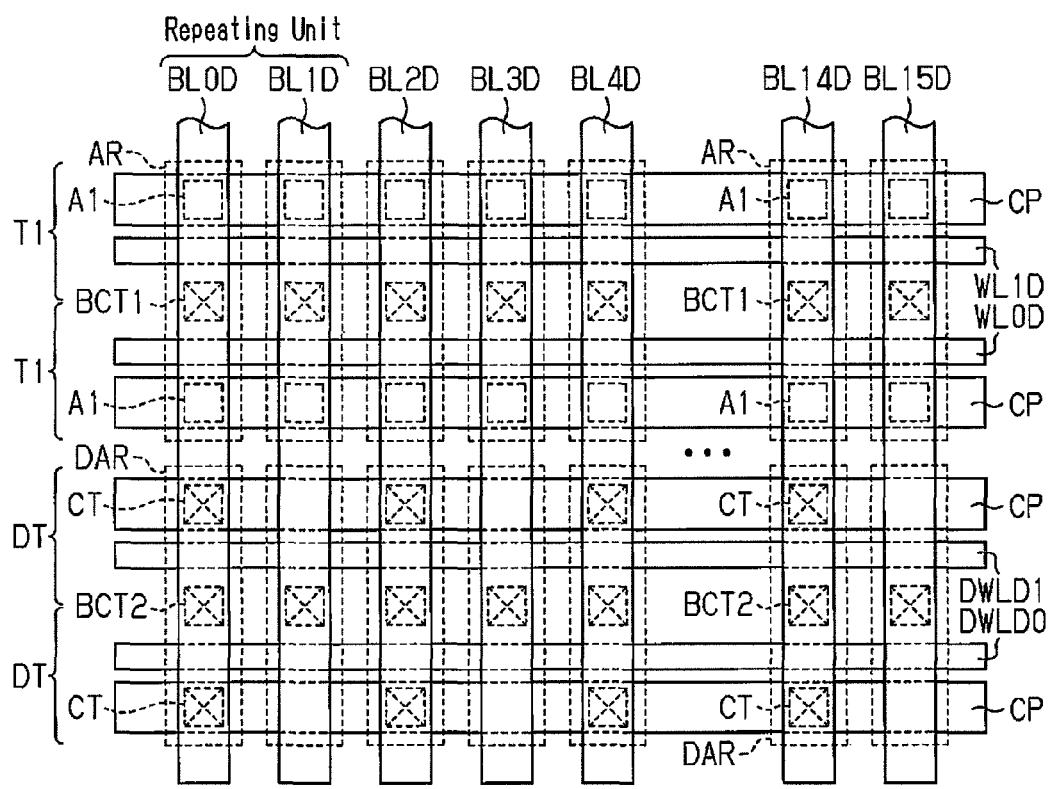
FIG. 9 is a layout diagram of the cell array.

The cell arrays 10U, 10D in the first embodiment may be laid out as illustrated in FIGS. 8 and 9. An arrangement example of a part of an array of m×16 memory cells MC and the dummy cells DMC of the cell arrays 10U, 10D is described below.

First, the layout of the cell array 10U is described with reference to FIG. 8.

The cell array 10U includes a memory cell-forming area and a dummy cell-forming area. The memory cells MC (cell transistors T1) are formed in the memory cell-forming area. The dummy cells DMC (dummy transistors DT) are formed in the dummy cell-forming area. The memory cell-forming area includes diffusion regions AR arranged in an m/2×16 array. The dummy cell-forming area includes diffusion regions DAR arranged in a 1×16 array. Each diffusion region AR, DAR has a long and narrow shape extending in the column direction (vertical direction of FIG. 8). The diffusion region AR, DAR may be, for example, defined by an element separating insulation film (not illustrated) having a shallow trench isolation (STI) structure.

A bit line contact BCT1 is arranged in a substantially central part of each diffusion region AR. Two cell transistors T1 are formed at the opposite sides of the bit line contact BCT1 in each diffusion region AR. The two cell transistors T1 share that bit line contact BCT1. A bit line contact BCT2 is arranged in a substantially central part of each diffusion region DAR. Two dummy transistors DT are arranged at the opposite sides of the bit line contact BCT2 in each diffusion region DAR. The two dummy transistors DT share that bit line contact BCT2.

Common bit lines BLU (BL0U to BL15U) extending in the column direction are formed on a plurality of diffusion regions AR and diffusion regions DAR arranged side by side in the column direction. Each bit line BL0U to BL15U is coupled to the bit line contact BCT1, BCT2 of the corresponding diffusion region AR, DAR.

On the plurality of diffusion regions AR arranged side by side in the row direction (horizontal direction of FIG. 8), two word lines WLU (e.g. word lines WL0U, WL1U) extending in the row direction across these diffusion regions AR are arranged at the opposite sides of the bit line contacts BCT1. Specifically, out of the two word lines WLU, the even-numbered word line WLU (e.g. word line WL0U) is arranged at a position below the bit line contacts BCT1 in FIG. 8 and the odd-numbered word line WLU (e.g. word line WL1U) is arranged at a position above the bit line contacts BCT1 in FIG. 8.

On the plurality of diffusion regions AR arranged side by side in the row direction, two plate electrodes CP extending in the row direction across these diffusion regions AR are arranged. The two plate electrodes CP are arranged at the outer sides of the corresponding word lines WLU with respect to the bit line contacts BCT1. A low-voltage supply voltage is applied to each plate electrode CP. For example, in the case of the cell transistor T1 in which the data "0" is written, a contact coupling the plate electrode CP with the diffusion region AR is formed in an area A1 where the plate electrode CP and the diffusion region AR overlap. In the case of the cell transistor T1 in which the data "1" is written, no contact is formed in the above area A1.

On the other hand, on the plurality of diffusion regions DAR arranged side by side in the row direction, a pair of dummy word lines DWLU0, DWLU1 extending in the row direction across each diffusion region DAR are arranged at the opposite sides of the bit line contacts BCT2. Specifically, the dummy word line DWLU0 is arranged at a position below the bit line contacts BCT2 in FIG. 8 and the dummy word lines DWLU1 is arranged at a position above the bit line contacts BCT2 in FIG. 8. The pair of these dummy word lines DWLU0, DWLU1 correspond to the dummy word line DWLU of FIG. 1.

On the plurality of diffusion regions DAR arranged side by side in the row direction, plate electrodes CP extending in the row direction across each diffusion region DAR are respectively arranged at the outer sides of the dummy word lines DWLU0, DWLU1 with respect to the bit line contacts BCT2. The low-voltage supply voltage is applied to these plate electrodes CP.

For example, in the diffusion region DAR coupled to the even-numbered bit line BLU (e.g. bit line BL0U) via the bit line contact BCT2, a contact CT is formed above and below the bit line contact BCT2. These contacts CT connect the diffusion region DAR and the plate electrodes CP. That is, in the above diffusion region DAR, two dummy transistors DT are formed at the opposite sides of the bit line contact BCT2.

As just described, in the layout of the dummy transistors DT of the illustrated embodiment, two dummy transistors DT are formed at the opposite sides of the bit line contact BCT2 in conformity with the shape of the cell transistor T1.

On the other hand, in the diffusion region DAR coupled to the odd-numbered bit line BLU (e.g. bit line BL1U) via the bit line contact BCT2, the above contact CT is not formed above and below the bit line contact BCT2. That is, the dummy transistors DT are not formed in the diffusion region DAR and the transistor DT1 (see FIG. 2) whose source is in an open state is formed.

An area where the dummy transistors DT corresponding to one even-numbered bit line BLU and one odd-numbered bit line BLU serves as a configurational repeating unit. That is, the arrangement of the diffusion regions DAR, the bit line contacts BCT2 and the contacts CT are the same, for example, in an area where the dummy transistors DT corresponding to the bit lines BL0U, BL1U are formed and an area where the dummy transistors DT corresponding to the bit lines BL2U, BL3U are formed.

Next, the layout of the cell array 10D is described with reference to FIG. 9. The layout of the cell array 10D is not described in detail here since being basically similar to that of the cell array 10U although differing in the positions where the cell transistors T1 and the dummy transistors DT are formed.

In an area where the memory cells MC (cell transistors T1) are formed, the even-numbered word line WLD (e.g. word line WL0D) is arranged below the bit line contacts BCT1 and the odd-numbered word line WLD (e.g. word line WL1D) is arranged above the bit line contacts BCT1. In the diffusion region AR, two cell transistors T1 are formed with respect to the bit line contact BCT1 as a center.

In an area where the dummy cells DMC (dummy transistors DT) are formed, the dummy word line DWLD0 is arranged below the bit line contacts BCT2 and the dummy word line DWLD1 is arranged above the bit line contacts BCT2. In the diffusion region DAR, two dummy transistors DT are formed with respect to the bit line contact BCT2 as a center.

Figure 10:
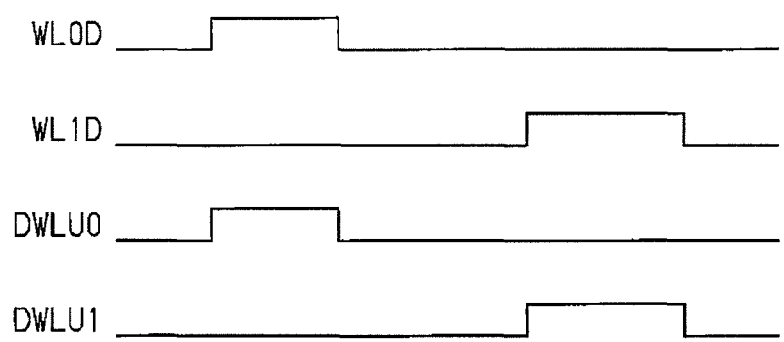
FIG. 10 is a timing chart illustrating a dummy word line selection method.

The controller 50 (see FIG. 1) when the cell arrays 10U, 10D are laid out in this way controls to select the dummy word line DWLU0 of the cell array 10U, for example, when the even-numbered word line WL0D of the cell array 10D is selected as illustrated in FIG. 10. At this time, the even-numbered word line WL0D is arranged below the bit line contact BCT1 and the plate electrode CP is arranged at the outer side of (below in FIG. 9) that word line WL0D. Thus, a current flows from the corresponding bit line BLD toward the plate electrode CP if the data "0" is written in the selected memory cell MC (cell transistor T1). Accordingly, a downward current flows in the cell transistor T1. On the other hand, the dummy word line DWLU0 is also arranged below the bit line contact BCT2 and the plate electrode CP is arranged below that dummy word line DWLU0. Thus, in the dummy transistor DT, a current flows from the bit line BLU toward the plate electrode CP. Accordingly, a downward current also flows in the dummy transistor DT. This may make the flowing direction of the current in the selected cell transistor T1 and that of the current in the dummy transistor DT equal. Therefore, a difference between the currents flowing in the respective transistors T1, DT due to a shape difference between the cell transistor T1 and the dummy transistor DT may be preferably suppressed.

Since only the dummy word line DWLU0 is selected in the above selection method, one dummy transistor DT is turned on out of the two dummy transistors DT formed in the diffusion region DAR. Since one dummy transistor DT is operated for two bit lines BLU in this way, a load of the bit line BLU on the dummy transistor DT is twice that on the cell transistor T1.

Similarly, the controller 50 selects the dummy word line DWLU1 of the cell array 10U, for example, when the odd-numbered word line WL1D of the cell array 10D is selected. When the word line formed below the bit line contacts BCT1 is selected in one cell array in this way, the dummy word line formed below the bit line contact BCT2 is selected in the other cell array. When the word line formed above the bit line contacts BCT1 is selected in one cell array, the dummy word line formed above the bit line contact BCT2 is selected in the other cell array.

The bit line contact BCT1 is an example of a first contact, the bit line contact BCT2 is an example of a second contact, the diffusion region AR is an example of a first diffusion region, the diffusion region DAR is an example of a second diffusion region, and the plate electrode CP is an example of first to fourth power supply wirings. The even-numbered word lines WL0U, WL0D are an example of a first word line, the odd-numbered word lined WL1U, WL1D are an example of a second word line, the dummy word lines DWLU0, DWLD0 are an example of a first dummy word line, and the dummy word lines DWLU1, DWLD1 are an example of a second dummy word line.

Figure 11A:
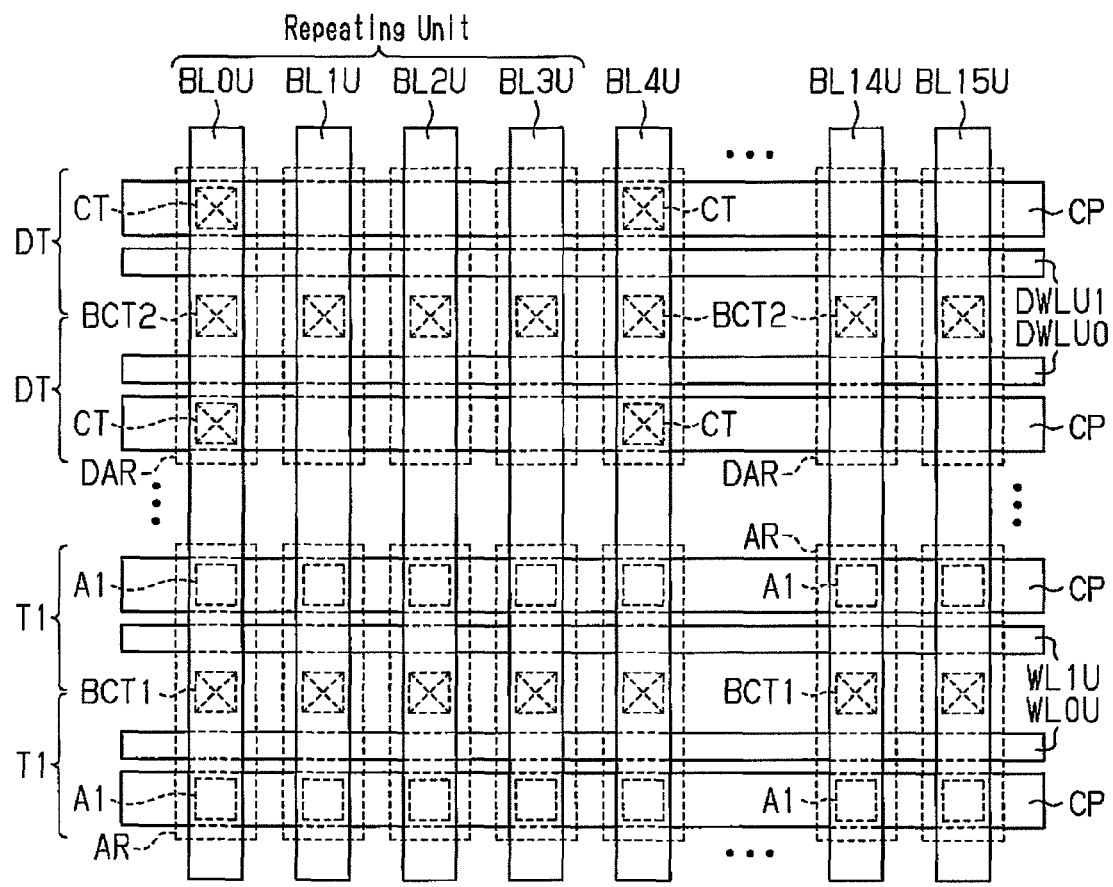
FIG. 11A is a layout diagram of the cell array and FIG. 11B is a timing chart illustrating the dummy word line selection method.
Figure 11B:
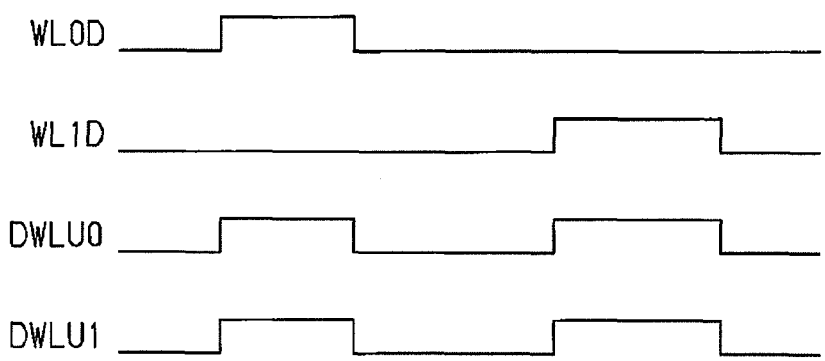

As illustrated in FIG. 11B, both of the dummy word lines DWLU0, DWLU1 may be selected in the other cell array 10U, for example, when arbitrary word lines WLD (e.g. word lines WL0D, WL1D) are selected in one cell array 10D. That is, in the cell array for generating the reference level of the sense amplifier 30, the two dummy transistors DT formed at the opposite sides of the bit line contact BCT2 may be turned on. This causes the operation of the dummy transistor DT in which a current flows upward and the dummy transistor DT in which a current flows downward. Thus, regardless of whether the current flows in the cell transistor T1 upward or downward, the shape difference between the cell transistor T1 and the dummy transistor DT may be averaged. Thus, a difference between currents flowing in the respective transistors T1, DT due to the shape difference may be preferably suppressed.

In this case, to operate one dummy transistor DT for two bit lines BLU, BLD, two dummy transistors DT are formed, for example, for the bit line BL0U and no dummy transistor DT is formed for the bit lines BL1U to BL3U as illustrated in FIG. 11A. Such a forming area of the dummy transistors DT corresponding to the four bit lines BL0U to BL3U serves as a configurational repeating unit. Although not illustrated, two dummy transistors DT are formed, for example, for the bit line BL0D and no dummy transistor DT is formed for the bit lines BL1D to BL3D also in the cell array 10D.

Figure 12A:
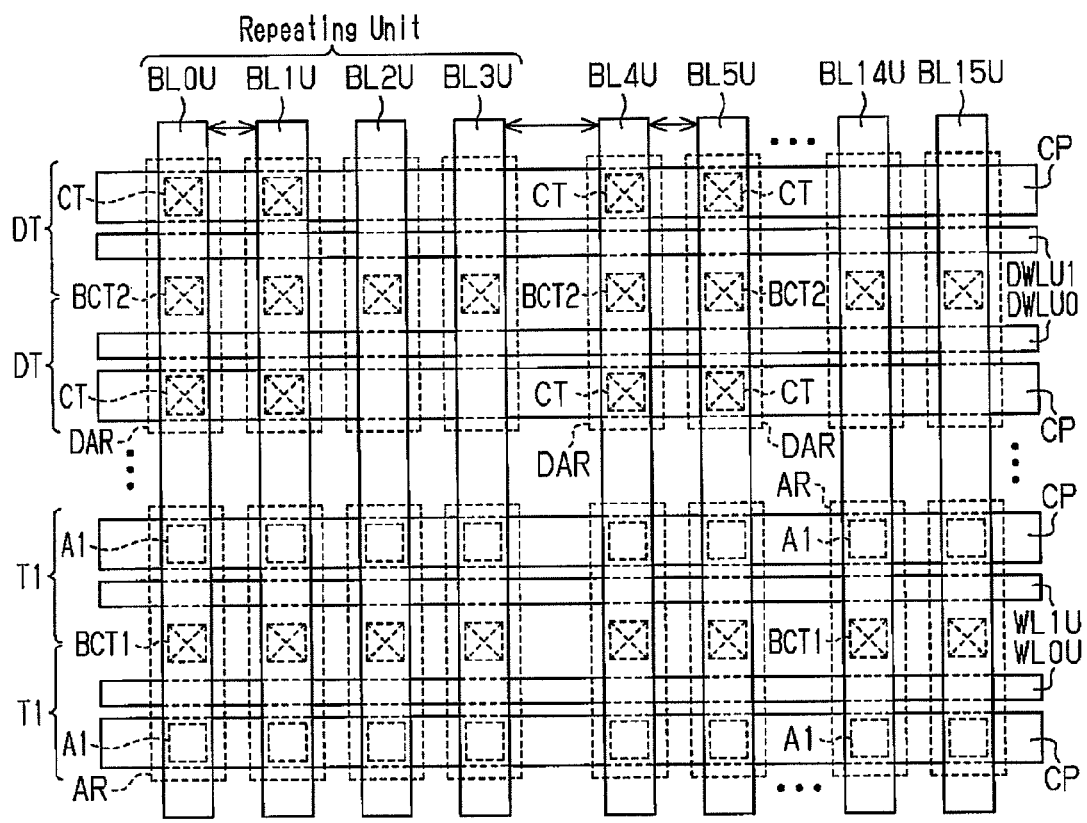
FIG. 12A is a layout diagram of the cell array and FIG. 12B is a timing chart illustrating the dummy word line selection method.

As illustrated in FIG. 12A, there are cases where distances between adjacent bit lines differ. Specifically, a distance between the bit lines BL0U and BL1U, that between the bit lines BL1U and BL2U and that between the bit lines BL2U and BL3U are equal, but shorter than a distance between the bit lines BL3U and BL4U. If the distances (pitches) between the bit lines differ in this way, loads (capacities) of the bit lines change. Thus, currents flowing in the cell transistors T1 and the dummy transistors DT also change.

Accordingly, as illustrated in FIG. 12A, the contacts CT may be arranged so that, for example, the dummy transistors DT at a long distance from the bit line on the left side of the figure and the dummy transistors DT at a short distance from the bit line on the left side of the figure may be operated. Specifically, in an example of FIG. 12A, the contacts CT are formed at opposite sides of the bit line contact BCT2 coupled to the bit line BL4U which is at a long distance from the bit line BL3U arranged on the left side of the figure. The contacts CT are formed at opposite sides of the bit line contact BCT2 coupled to the bit line BL5U which is at a short distance from the bit line BL4U arranged at the left side of FIG. 12. Similarly, for the bit lines BL0U, BL1U, the contacts CT are formed at opposite sides of the bit line contacts BCT2 coupled to those bit lines BL0U, BL1U.

Although not illustrated, the cell array 10D is similarly laid out.

Figure 12B:
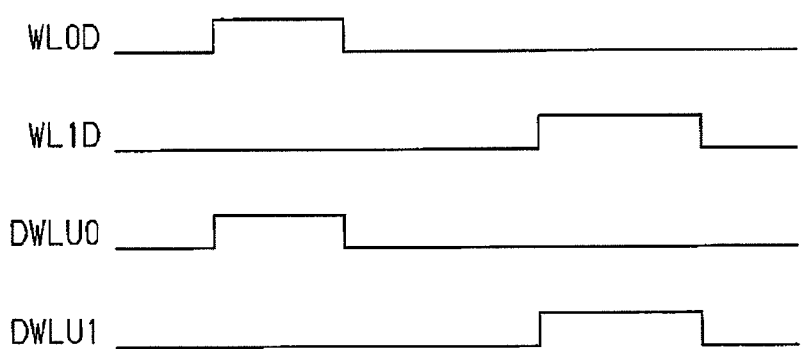

When the cell arrays 10U, 10D are laid out in this way, the controller 50 (see FIG. 1) controls to select the dummy word line DWLU0 of the cell array 10U, for example, when the even-numbered word line WL0D of the cell array 10D is selected as illustrated in FIG. 12B. This causes the operation of the dummy transistors DT at a long distance from the bit line on the illustrated left side of the figure and the dummy transistors DT at a short distance from the bit line on the left side of the figure. Accordingly, even if the bit line BLD selected in the cell array 10D is a bit line at a long distance from the bit line on the left side or a bit line at a short distance from the bit line on the left side, the shape difference between the cell transistors T1 and the dummy transistors DT caused by a difference between the distances (shapes) may be averaged. Thus, a difference between currents flowing in the respective transistors T1, DT due to the shape difference may be preferably suppressed. Further, since the direction of the current flowing in the selected cell transistor T1 and that of the current flowing in the dummy transistor DT may be made equal, a difference between the currents flowing in the respective transistors T1, DT may be preferably suppressed.

Even in this case, to operate one dummy transistor DT for two bit lines BLU, BLD, two dummy transistors DT are formed, for example, for the bit lines BL0U, BL1U and no dummy transistor DT is formed for the bit lines BL2U, BL3U as illustrated in FIG. 12A. Such a forming area of the dummy transistors DT corresponding to the four bit lines BL0U to BL3U serves as a configurational repeating unit.

Figure 13:
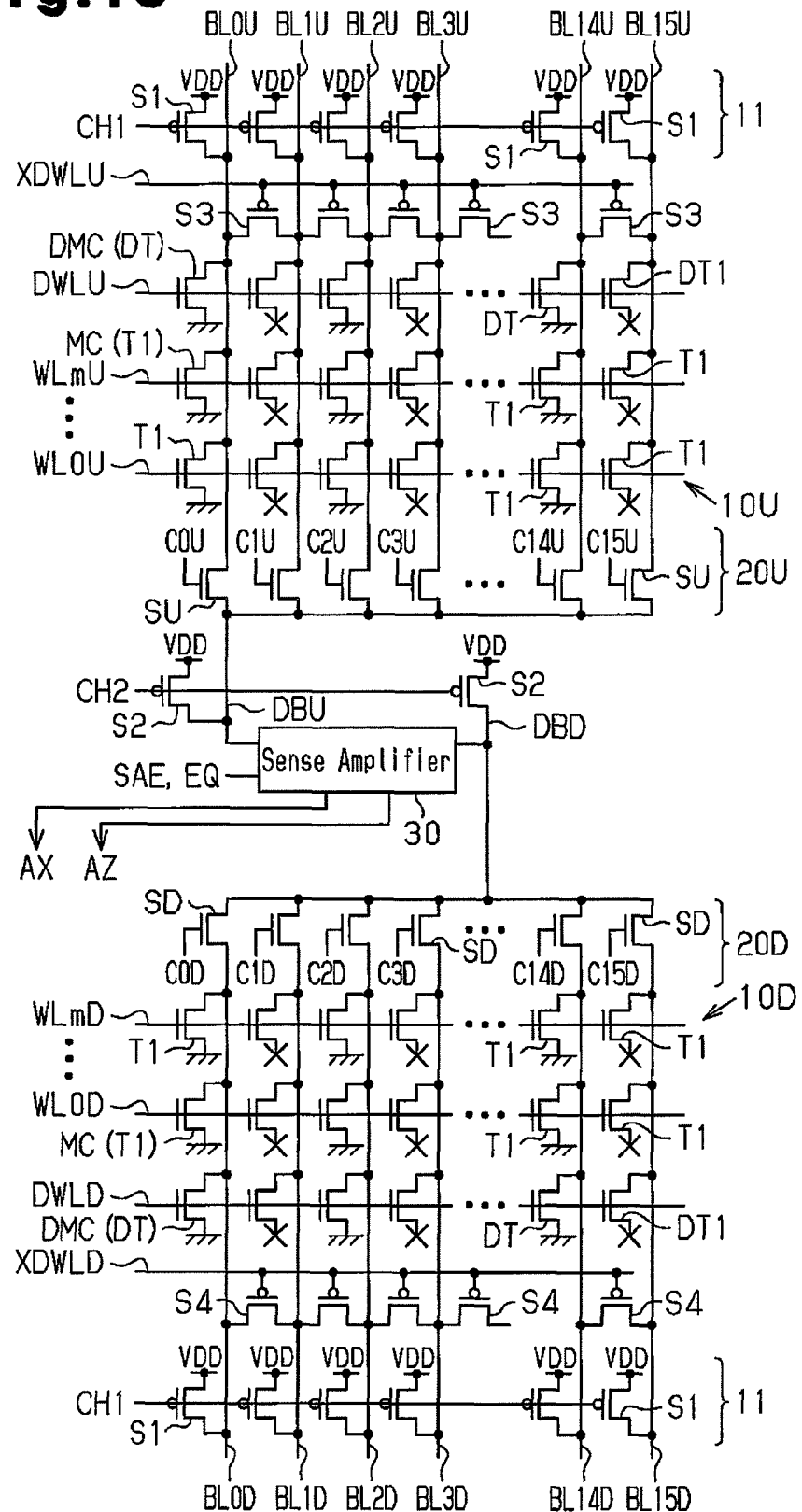
FIG. 13 is a block circuit diagram illustrating internal configuration examples of cell arrays and column switches according to a modification.

As illustrated in FIG. 13, switch circuits S3 for short-circuiting between the bit lines BL0U to BL15U may be provided for the cell array 10U. Switch circuits S4 for short-circuiting between the bit lines BL0D to BL15D may be provided for the cell array 10D.

The switch circuits S3 are provided near (right above or right below) the dummy cells DMC. The switch circuits S3 are, for example, P-channel MOS transistors. First and second terminals of the switch circuits S3 are respectively coupled to the adjacent bit lines BLU, and a control signal XDWLU is supplied to control terminals thereof. Each switch circuit S3 is turned on in response to the control signal XDWLU of L level. When the switch circuits S3 are turned on, all the bit lines BL0U to BL15U are short-circuited. For example, the control signal XDWLU is a signal obtained by logically inverting a signal to be provided to the dummy word lines DWLU. Thus, when the dummy word lines DWLU are activated and the reference level of the sense amplifier 30 is generated by the dummy cells DMC, the switches S3 are turned on in response to the control signal XDWLU of L level and all the bit lines BL0U to BL15U are short-circuited.

When all the bit lines BL0U to BL15U are selected only by the column switches SU, loads (parasitic capacities) of the bit lines BLU are made difficult to see by the resistance of the column switch SU. For example, the dummy cells DMC coupled to the bit line BL0U are coupled to the bit line BL1U via two column switches SU and a load of that bit line BL1U is difficult to see. Then, a bit line load seen from the dummy cells DMC is smaller than an actual bit line load (bit line load twice that of the memory cells MC), wherefore the reference level of the sense amplifier 30 generated by the dummy cells DMC approaches a voltage at the time of reading the data "0". For this, the switch circuits S3 for short-circuiting all the bit lines BL0U to BL15U when the dummy word lines DWLU are activated are provided in the above configuration. Since this makes the parasitic capacities of the bit lines BLU reliably seeable from the dummy cells DMC, a desired reference level may be preferably generated by the dummy cells DMC.

The switch circuits S4 are provided near (right above or right below) the dummy cells DMC. The switch circuits S4 are, for example, P-channel MOS transistors. First and second terminals of the switch circuits S4 are respectively coupled to the adjacent bit lines BLD, and a control signal XDWLD is supplied to control terminals thereof. For example, the control signal XDWLD is a signal obtained by logically inverting a signal to be provided to the dummy word lines DWLD. Thus, when the dummy word lines DWLD are activated and the reference level of the sense amplifier 30 is generated by the dummy cells DMC, the switches S4 are turned on in response to the control signal XDWLD of L level and all the bit lines BL0D to BL15D are short-circuited.

The switch circuits S3, S4 are an example of a third switch circuit.

The precharge circuits 11 in the cell arrays 10U, 10D of the first embodiment may be omitted. In this case, the bit lines BLU, BLD and the data bit lines DBU, DBD may be precharged to H level utilizing the switch circuits S2, for example, before data is read from the cell array 10U, 10D.

Figure 14:
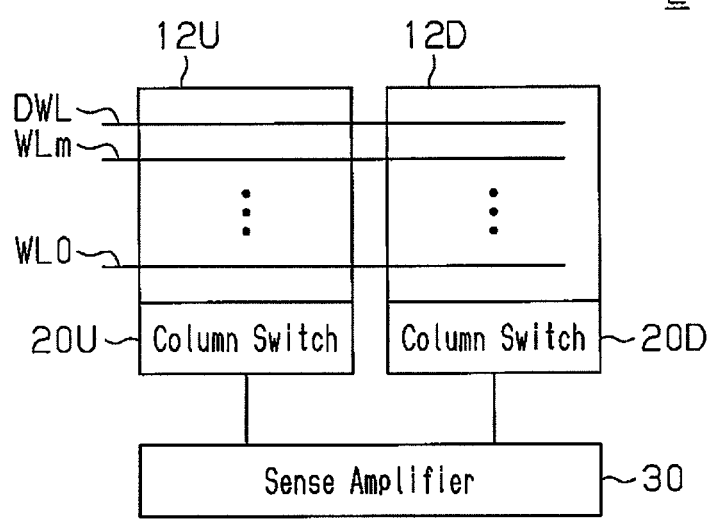
FIG. 14 is a block diagram illustrating a semiconductor memory device of a second embodiment.
Figure 15:
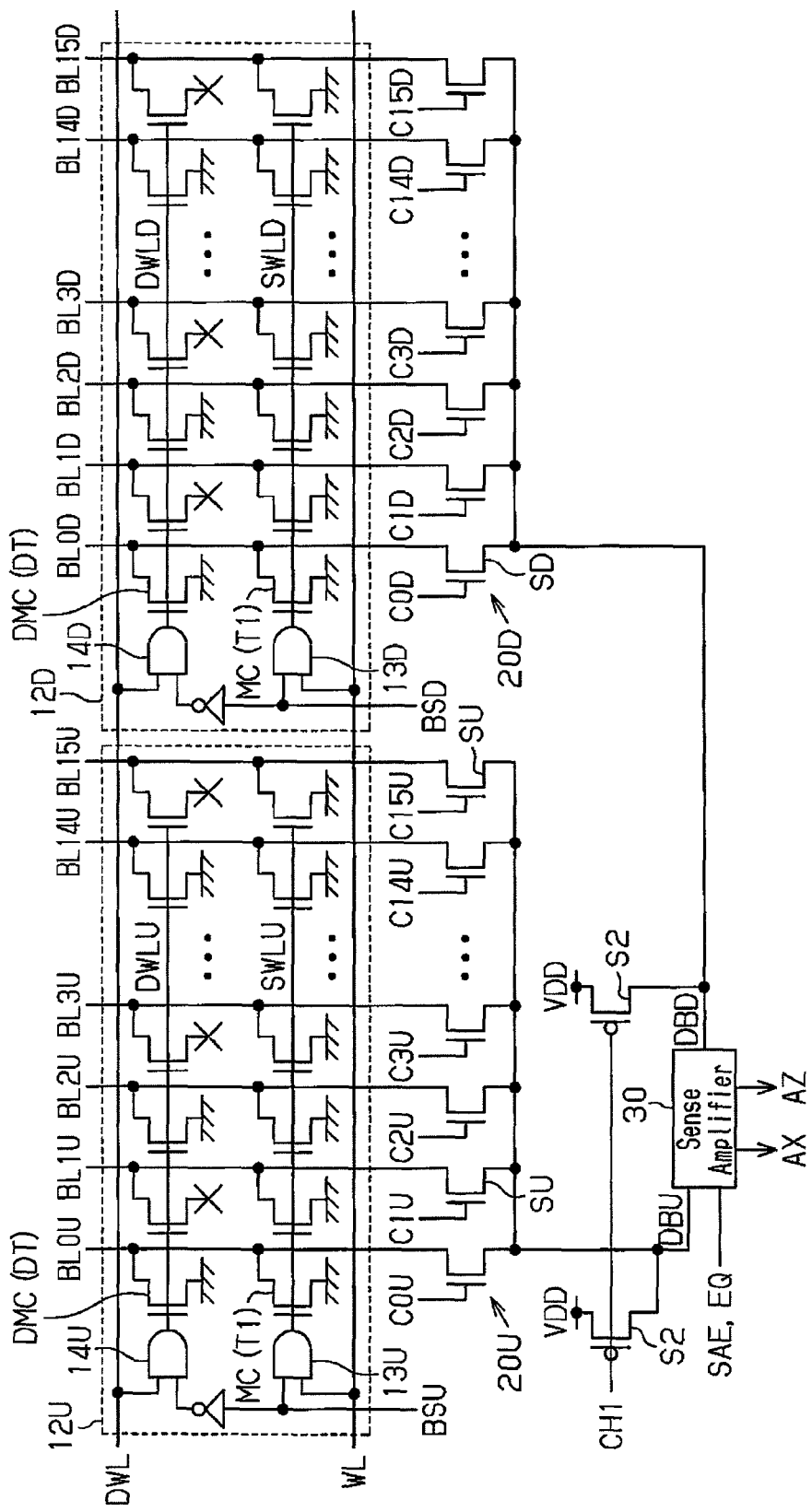
FIG. 15 is a block circuit diagram illustrating internal configuration examples of cell arrays and column switches of the second embodiment.
Figure 16:
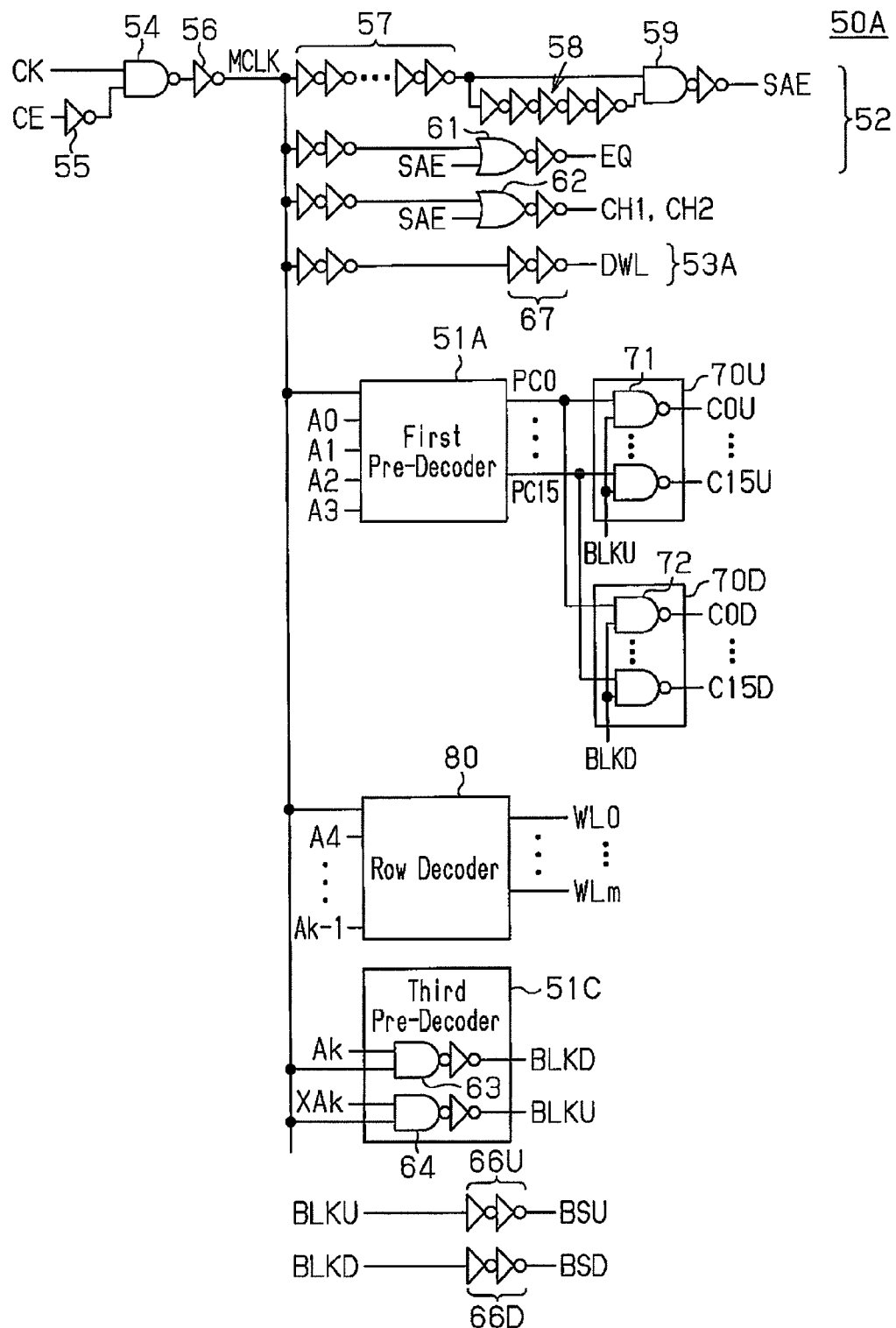
FIG. 16 is a block circuit diagram illustrating an internal configuration example of a controller of the second embodiment.

A second embodiment is described below with reference to FIGS. 14 to 16. The same members as the previous members illustrated in FIGS. 1 to 13 are respectively denoted by the same reference signs and each of these elements is not described in detail. The following description is centered on points of difference from the first embodiment.

In the first embodiment, one sense amplifier 30 is shared by the two cell arrays 10U, 10D arranged side by side in the column direction and, in reading data from one cell array, the reference level of the sense amplifier 30 is generated by the dummy cells DMC provided in the other cell array. Contrary to this, in a semiconductor memory device 2 of the second embodiment, two cell arrays 12U, 12D arranged side by side in the row direction share one sense amplifier 30 and, in reading data from one cell array, a reference level of a sense amplifier 30 is generated by dummy cells provided in the other cell array as illustrated in FIG. 14. In such two cell arrays 12U, 12D, word lines WL0 to WLm are shared and dummy word lines DWL are shared.

Next, internal configuration examples of the cell arrays 12U, 12D are described with reference to FIG. 15. Here, only one word line WL is illustrated as word lines WL (generally indicating word lines WL0 to WLm) to simplify the drawing.

In the cell array 12U, an AND circuit 13U is provided for each word line WL. The corresponding word line WL is coupled to the AND circuit 13U and a selection signal BSU is provided thereto. An internal word line SWLU formed in the cell array 12U is coupled to an output terminal of the AND circuit 13U. For example, the selection signal BSU is a signal obtained by delaying a selection signal BLKU by an operation delay time of an inverter circuit 66U in an even-numbered stage in a controller 50A illustrated in FIG. 16. Thus, the selection signal BSU is a signal which becomes H level when the cell array 12U is accessed and becomes L level when the cell array 12U is not accessed. In a row decoder 80, address signals A4 to Ak−1 are decoded and any one word line WL of the word lines WL0 to WLm is activated. Thus, in FIG. 15, an output signal of the AND circuit 13U becomes H level and the voltage of the internal word line SWLU becomes H level if the word line WL is activated when the cell array 12U is accessed. In other words, the AND circuit 13U fulfills the same function as the NAND circuit 81 of the row decoder 80U illustrated in FIG. 4.

An AND circuit 14U coupled to the dummy word line DWL is provided in the cell array 12U. The above selection signal BSU is provided to the AND circuit 14U via an inverter circuit. The dummy word line DWLU formed in the cell array 12U is coupled to an output terminal of the AND circuit 14U. For example, in a dummy word line driver 53A illustrated in FIG. 16, a signal obtained by delaying a clock signal MCLK by a predetermined time by an inverter circuit 67 in an even-numbered stage is provided to the dummy word line DWL. Thus, in FIG. 15, an output signal of the AND circuit 14U becomes H level and the voltage of the dummy word line DWLU becomes H level upon the elapse of a predetermined time from the rise of the clock signal MCLK when the cell array 12U is not accessed. In other words, the AND circuit 14U fulfills the same function as the NAND circuit 65 of the dummy word line driver 53 illustrated in FIG. 4.

The cell array 12U includes memory cells MC (cell transistors T1) provided at intersections of internal word lines SWLU and bit lines BLU and dummy cells DMC (dummy transistors DT) provided at intersections of dummy word lines DWLU and the bit lines BLU. The bit lines BL0U to BL15U are respectively coupled to a common data bit line DBU via column switches SU to which column selection signals C0U to C15U are respectively provided and further coupled to a sense amplifier 30 via the data bit line DBU.

Since cell array 12D having substantially the same configuration as the cell array 12U, similar elements are denoted by the same reference signs or by replacing "U" at the ends of the reference signs of the elements of the cell array 12U by "D", and each element is not described in detail. A selection signal BSD supplied to the cell array 12D is generated by delaying a selection signal BLKD by an operation delay time of an inverter circuit 66D in an even-numbered stage as illustrated in FIG. 16. Thus, the selection signal BSD is a signal which becomes H level when the cell array 12D is accessed and becomes L level when the cell array 12D is not accessed.

Also in such a semiconductor memory device 2, in reading data from one cell array 12U, the dummy word lines DWLD of the other cell array 12D are activated and all column selection signals C0D to C15D become H level and all bit lines BL0D to BL15D are selected as in the first embodiment. By this, a reference level of the sense amplifier 30 is generated by the dummy cells DMC (dummy transistors DT) that are in a conductive state.

According to the second embodiment, the same effects as in the first embodiment are achieved.

A third embodiment is described below with reference to FIGS. 17 and 18. The same members as the previous members illustrated in FIGS. 1 to 16 are respectively denoted by the same reference signs and each of these elements is not described in detail. The following description is centered on points of difference from the second embodiment.

Figure 17:
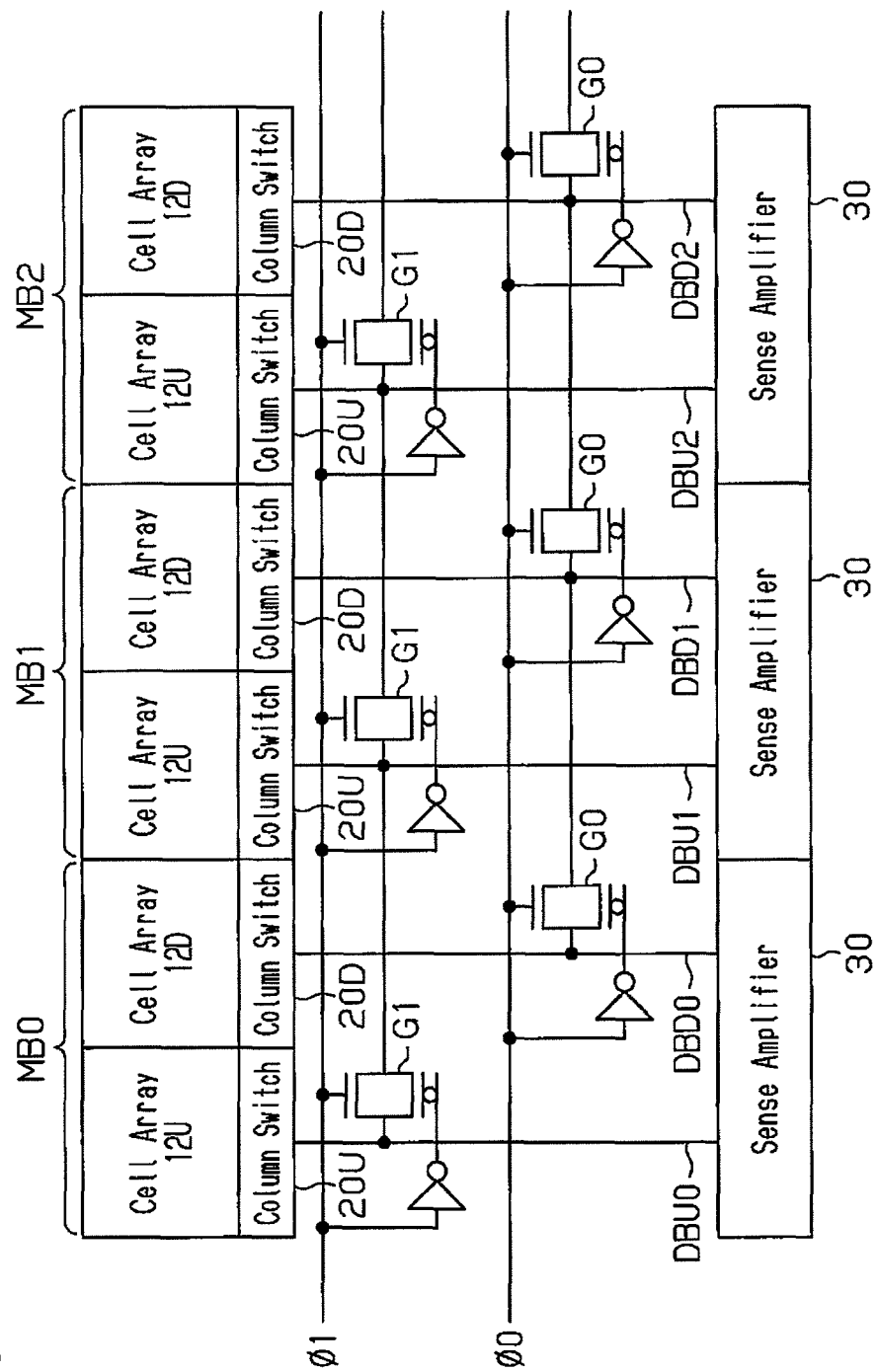
FIG. 17 is a block diagram illustrating a semiconductor memory device of a third embodiment.

As illustrated in FIG. 17, a semiconductor memory device 3 includes a plurality of (three in FIG. 17) memory blocks MB0 to MB2. One memory block corresponds to one data (I/O) terminal (not illustrated). That is, data read from each memory block MB0 to MB2 is provided from one corresponding I/O terminal.

Each memory block MB0 to MB2 includes cell arrays 12U, 12D, column switches 20U, 20D and a sense amplifier 30 shared by the two cell arrays 12U, 12D. In the memory block MB0, the column switches 20U, 20D are coupled to the sense amplifier 30 respectively via data bit lines DBU0, DBD0. In the memory block MB1, the column switches 20U, 20D are coupled to the sense amplifier 30 respectively via data bit lines DBU1, DBD1. In the memory block MB2, the column switches 20U, 20D are coupled to the sense amplifier 30 respectively via data bit lines DBU2, DBD2.

The data bit lines DBD0 to DBD2 are coupled to each other via transfer gates G0. These transfer gates G0 are turned on in response to a control signal φ0 of H level and turned off in response to a control signal φ0 of L level. The data bit lines DBU0 to DBU2 are coupled to each other via transfer gates G1. These transfer gates G1 are turned on in response to a control signal φ1 of H level and turned off in response to a control signal φ0 of L level.

For example, the control signals φ0, φ1 are complementary signals and respectively become H level and L level, for example, when the cell array 12U is accessed. Thus, the transfer gates G0 are turned on in response to the control signal φ0 of H level and the transfer gates G1 are turned off in response to the control signal φ1 of L level when the cell array 12U is accessed. By this, the data bit lines DB0U to DB2U are separated from the other data bit lines and a plurality of data bit lines DBD0 to DBD2 are coupled to each other. In this way, reference levels of the sense amplifiers 30 are generated by dummy cells DMC (see FIG. 15) provided in a plurality of cell arrays 12D coupled to the plurality of data bit lines DBD0 to DBD.

Next, the control signals φ0, φ1 are further described in detail.

As illustrated in FIG. 18, in a controller 50B, a clock signal MCLK delayed by a predetermined time by an inverter circuit in an even-numbered stage is provided to an NAND circuit 68, and a selection signal BLKU is provided to the NAND circuit 68. An output signal SAE1 of an NAND circuit 59 of a sense amplifier driver 52 is provided to the NAND circuit 68. An output signal of the NAND circuit 68 is output as the control signal φ0 via an inverter circuit. The control signal φ0 is at H level only while the clock signal MCLK is at H level and the output signal SAE1 of the NAND circuit 59 is at H level when the cell array 12U is accessed, i.e. when the selection signal BLKU is at H level. The transfer gates G0 are turned on in response to the control signal φ0 of H level and the data bit lines DBD0 to DBD2 are coupled to each other. The control signal φ0 falls to L level in response to the fall of the output signal SAE1 of the NAND circuit 59 when the cell array 12U is accessed. Thus, the control signal φ0 falls to L level before the sense amplifier 30 is activated in response to a sense amplifier enable signal SAE of H level. By this, the data bit lines DBD0 to DBD2 are separated from the other data bit lines before the sense amplifier 30 is activated.

On the other hand, the control signal φ0 becomes L level in response to the selection signal BLKU of L level when the cell array 12D is accessed, i.e. when the selection signal BLKU is at L level. The transfer gates G0 are turned off in response to the control signal φ0 of L level and the data bit lines DBD0 to DBD2 are separated from the other data bit lines.

Similarly, in the controller 50B, the clock signal MCLK delayed by a predetermined time by an inverter circuit in the even-numbered stage is provided to an NAND circuit 69, and a selection signal BLKD and the output signal SAE1 of the NAND circuit 59 are provided to the NAND circuit 69. An output signal of the NAND circuit 69 is provided as the control signal φ1 via an inverter circuit.

The cell array 12D is an example of a first memory cell array, the cell array 12U is an example of a second memory cell array, the transfer gates G0 is an example of a first switch circuit, the transfer gates G1 is an example of a second switch circuit, the data bit lines DBU0 to DBU2 are an example of a common bit line, and the data bit lines DBD0 to DBD2 are an example of the common bit line.

According to the third embodiment, the following effect is achieved in addition to the effects (1) and (2) of the first embodiment.

(3) In generating the reference level of the sense amplifier 30, the dummy cells DMC provided in a plurality of cell arrays 12U, 12D are operated. Since the dummy cells DMC used in generating the reference level may be increased by this, an influence caused by characteristic variations of the dummy cells DMC (dummy transistors T1) due to manufacturing variations and the like may be reduced.

A fourth embodiment is described below with reference to FIGS. 19 to 22. The same members as the previous members illustrated in FIGS. 1 to 18 are respectively denoted by the same reference signs and each of these elements is not described in detail. The following description is centered on points of difference from the first embodiment.

In the first embodiment, the two cell arrays 10U, 10D share one sense amplifier 30 and, in reading data from one cell array, the reference level of the sense amplifier 30 is generated by the dummy cells DMC provided in the other cell array. Contrary to this, in a semiconductor memory device 4 of the fourth embodiment, two cell arrays 15U, 15D share one sense amplifier 90 and, in reading data from one cell array, a latch signal La for determining a latch timing of the sense amplifier 90 is generated by dummy cells DMC provided in the other cell array.

Figure 19:
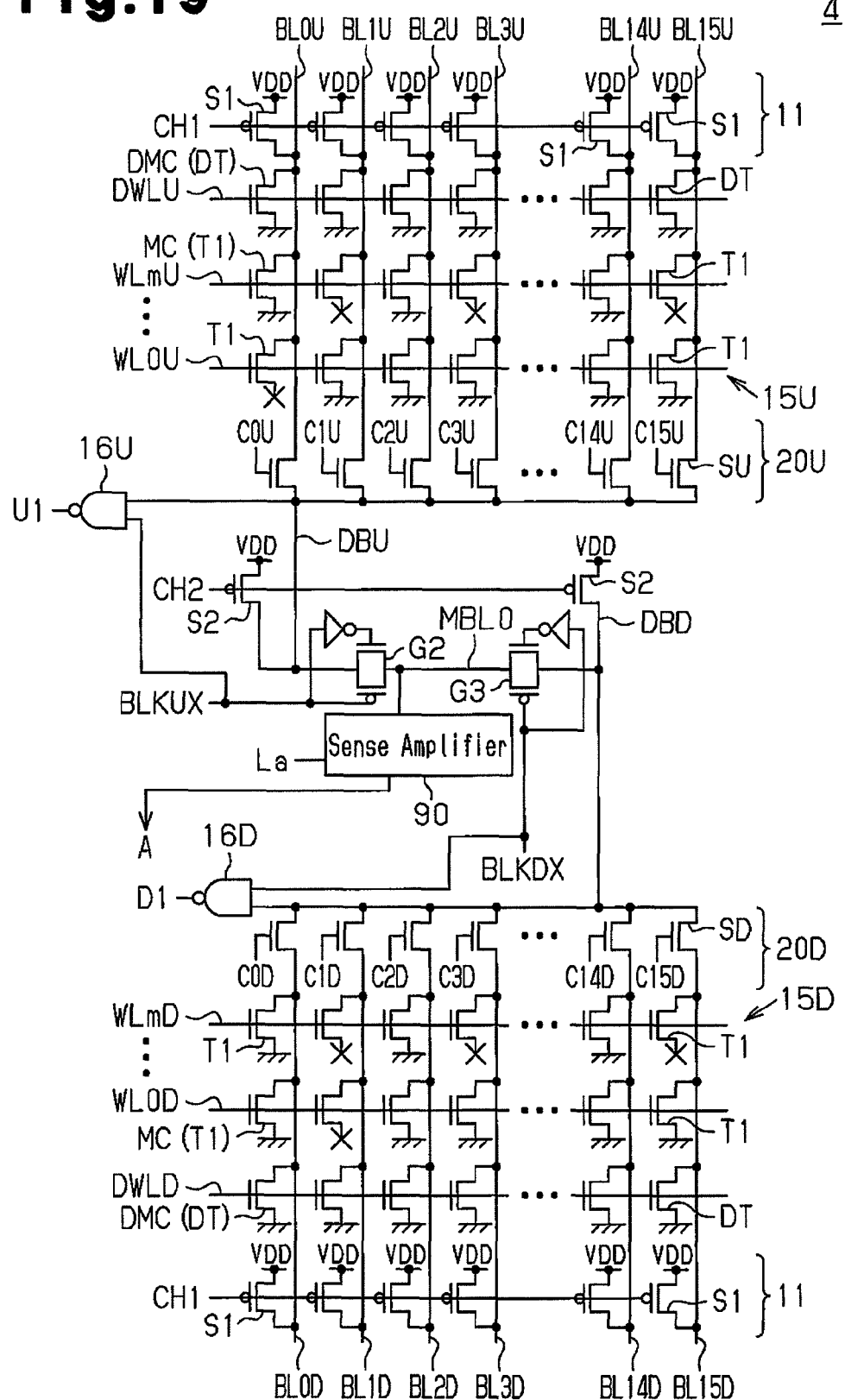
FIG. 19 is a block circuit diagram illustrating internal configuration examples of cell arrays and column switches of a fourth embodiment.

As illustrated in FIG. 19, the cell array 15U includes memory cells MC provided at intersections of word lines WLU and bit lines BLU, dummy cells DMC provided at intersections of dummy word lines DWLU and the bit lines BLU, and a precharge circuit 11 for precharging each bit line BLU to a voltage level of a high-voltage power supply VDD.

Each memory cell MC includes one cell terminal T1. Each dummy cell DMC includes one dummy transistor DT. The dummy transistor DT has the same electrical characteristics as the cell terminal T1. That is, the dummy transistor DT is a replica transistor which is a replica of the cell transistor T1. A drain of each dummy transistor DT is coupled to the corresponding bit line BLU, a source thereof is coupled to the ground, and a gate thereof is coupled to the dummy word line DWLU. The dummy transistor DT is provided for all the bit lines BL0U to BL15U.

A column switch SU is coupled to each bit line BL0U to BL15U. A first terminal (e.g. drain) of each column switch SU is coupled to the bit line BLU and a second terminal (e.g. source) thereof is coupled to a data bit line DBU and an NAND circuit 16U. For example, when the cell array 15U is not accessed, all column selection signals C0U to C15U become H level and all the column switches SU are turned on. Thus, when the cell array 15U is not accessed, all the bit lines BL0U to BL15U are commonly coupled to the NAND circuit 16U. A control signal BLKUX is provided to the NAND circuit 16U. A control signal U1 is provided from the NAND circuit 16U. For example, the control signal BLKUX is a signal generated by delaying a selection signal BLKD by an operation delay time of an inverter circuit 101 in an even-numbered stage in a controller 50C illustrated in FIG. 21. Thus, the control signal BLKUX becomes H level when the cell array 15D is accessed and becomes L level when the cell array 15D is not accessed. Therefore, the control signal U1 of H level is output regardless of the data bit line DBU when the cell array 15D is not accessed, and an inverted signal of the data bit line DBU is output as the control signal U1 when the cell array 15D is accessed.

The data bit line DBU is coupled to a main bit line MBL0 via a transfer gate G2. The transfer gate G2 is turned on in response to the control signal BLKUX of L level and turned off in response to the control signal BLKUX of H level. Thus, when the cell array 15D is not accessed, the transfer gate G2 is turned on and the data bit line DBU is coupled to the sense amplifier 90 via the main bit line MBL0. On the other hand, when the cell array 15D is accessed, the transfer gate G2 is turned off, the data bit line DBU is separated from the main bit line MBL0 and the sense amplifier 90.

Since the cell array 15D has substantially the same configuration as the cell array 15U, similar elements are denoted by the same reference signs or by replacing "U" at the ends of the reference signs of the elements of the cell array 15U by "D", and each element is not described in detail.

A first terminal (e.g. drain) of each column switch SD coupled to each bit line BL0D to BL15D is coupled to the bit line BLD and a second terminal (e.g. source) thereof is coupled to a data bit line DBD and an NAND circuit 16D. For example, when the cell array 15D is not accessed, all column selection signals C0D to C15D become H level and all the column switches SD are turned on. Thus, when the cell array 15D is not accessed, all the bit lines BL0D to BL15D are commonly coupled to the NAND circuit 16D. A control signal BLKDX is provided to the NAND circuit 16D. A control signal D1 is provided from the NAND circuit 16D. For example, in the controller 50C illustrated in FIG. 21, the control signal BLKDX is a signal generated by delaying a selection signal BLKU by an operation delay time of an inverter circuit 102 in an even-numbered stage. Thus, the control signal BLKDX becomes H level when the cell array 15U is accessed and becomes L level when the cell array 15U is not accessed. Therefore, the control signal D1 of H level is output regardless of the data bit line DBD when the cell array 15U is not accessed, and an inverted signal of the data bit line DBD is output as the control signal D1 when the cell array 15U is accessed.

The data bit line DBD is coupled to the data bit line MBL0 via a transfer gate G3. The transfer gate G3 is turned on in response to the control signal BLKDX of L level and turned off in response to the control signal BLKDX of H level.

Figure 20:
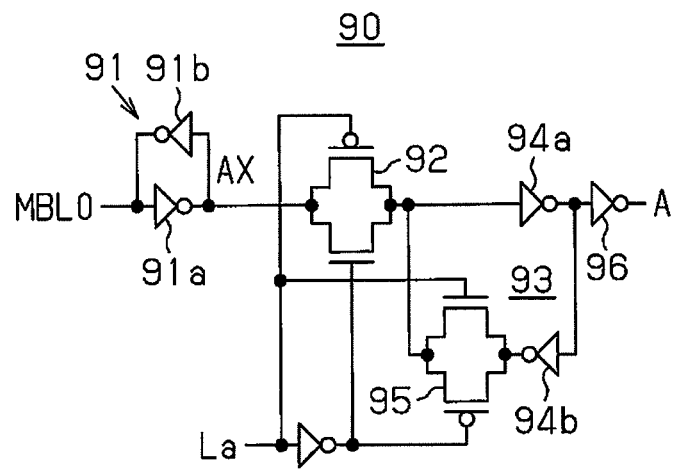
FIG. 20 is a circuit diagram illustrating an internal configuration example of a sense amplifier of the fourth embodiment.
Figure 21:
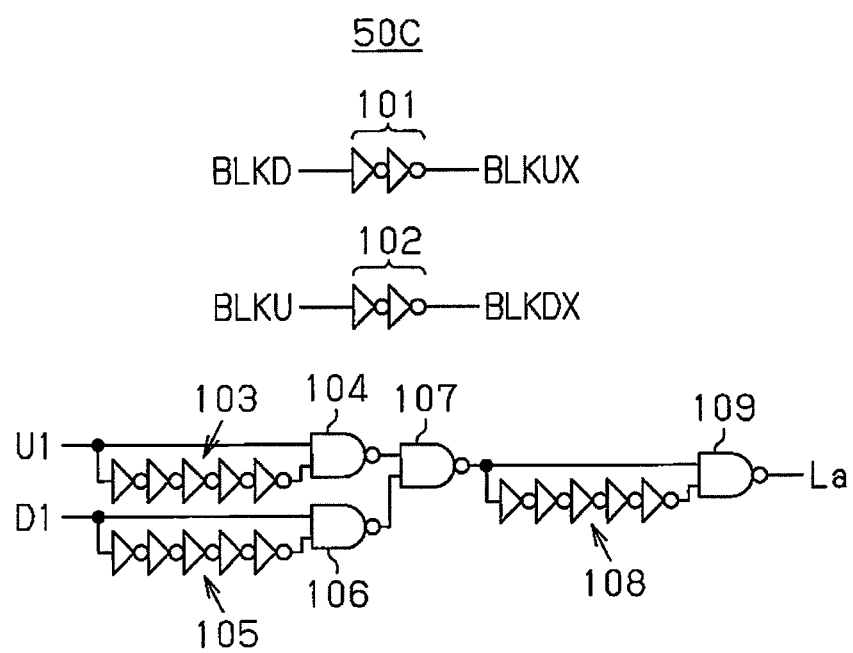
FIG. 21 is a block circuit diagram illustrating an internal configuration example of a controller of the fourth embodiment.

Next, an internal configuration example of the sense amplifier 90 is described with reference to FIG. 20.

In the sense amplifier 90, the voltage of the main bit line MBL0 is supplied to a latch circuit 91. The latch circuit 91 includes an inverter circuit 91a whose input terminal is coupled to the main bit line MBL0 and an inverter circuit 91b whose input terminal is coupled to an output terminal of the inverter circuit 91a and whose output terminal is coupled to the input terminal of the inverter circuit 91a. Although not illustrated, the high-voltage power supply VDD and the ground are coupled to these inverter circuits 91a, 91b. The latch circuit 91 determines the voltage of the main bit line MBL0 and provides it as read data AX of H level or L level to a transfer gate 92.

One end of the transfer gate 92 is coupled to the output terminal of the latch circuit 91 (inverter circuit 91a) and the other end thereof is coupled to an input terminal of a latch circuit 93. The transfer gate 92 is such that a P-channel MOS transistor and an N-channel MOS transistor are coupled in parallel. The transfer gate 92 is turned on in response to a latch signal La of L level and turned off in response to a latch signal La of H level.

The latch circuit 93 includes inverter circuits 94a, 94b and a transfer gate 95. The transfer gate 95 is present between an input terminal of the inverter circuit 94a and an output terminal of the inverter circuit 94b.

The transfer gate 95 is such that a P-channel MOS transistor and an N-channel MOS transistor are coupled in parallel. The transfer gate 95 is turned on in response to a latch signal La of H level and turned off in response to a latch signal La of L level. Thus, the transfer gate 95 is turned off when the transfer gate 92 is turned on while being turned on when the transfer gate 92 is turned off.

A signal latched by the latch circuit 93 is provided as output data A to the outside via an inverter circuit 96.

Next, the latch signal La supplied to the transfer gates 92, 95 of the sense amplifier 90 is described. The latch signal La is generated in accordance with the above control signals U1, D1 in the controller 50C illustrated in FIG. 21.

Specifically, the control signal U1 generated in the cell array 15U is supplied to an NAND circuit 104 via an inverter circuit 103 in an odd-numbered stage (fifth stage in FIG. 21) as well as directly supplied to the NAND circuit 104. The control signal D1 generated in the cell array 15D is supplied to an NAND circuit 106 via an inverter circuit 105 in an odd-numbered stage (fifth stage in FIG. 21) as well as directly supplied to the NAND circuit 106. Output signals of the NAND circuits 104, 106 are provided to an NAND circuit 107. An output signal of the NAND circuit 107 is supplied to an NAND circuit 109 via an inverter circuit 108 in an odd-numbered stage (fifth stage in FIG. 21) as well as directly supplied to the NAND circuit 109. An output signal of the NAND circuit 109 is output as the above latch signal La.

Figure 22:
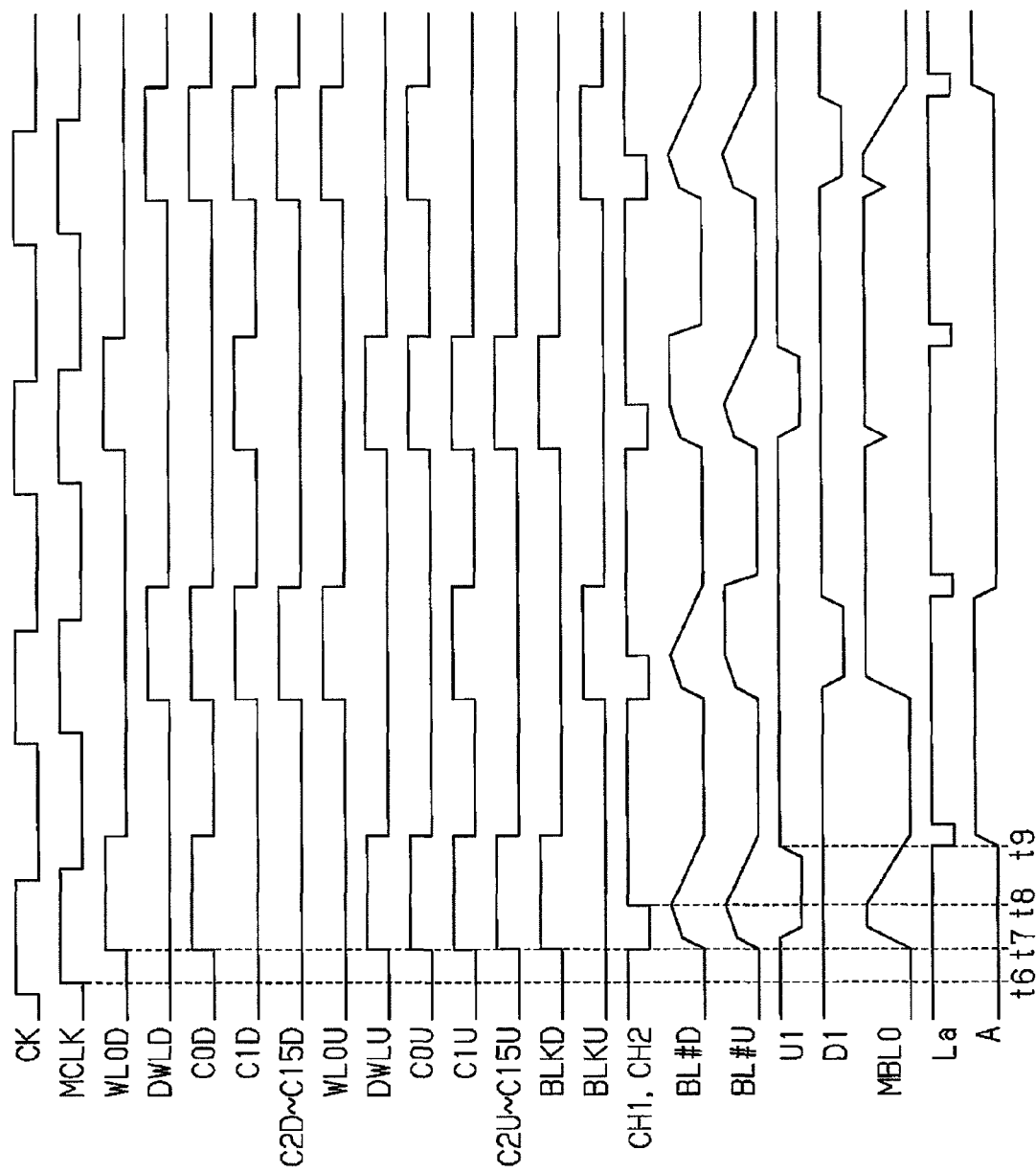
FIG. 22 is a timing chart illustrating the operation of a semiconductor memory device of the fourth embodiment.
Figure 23:
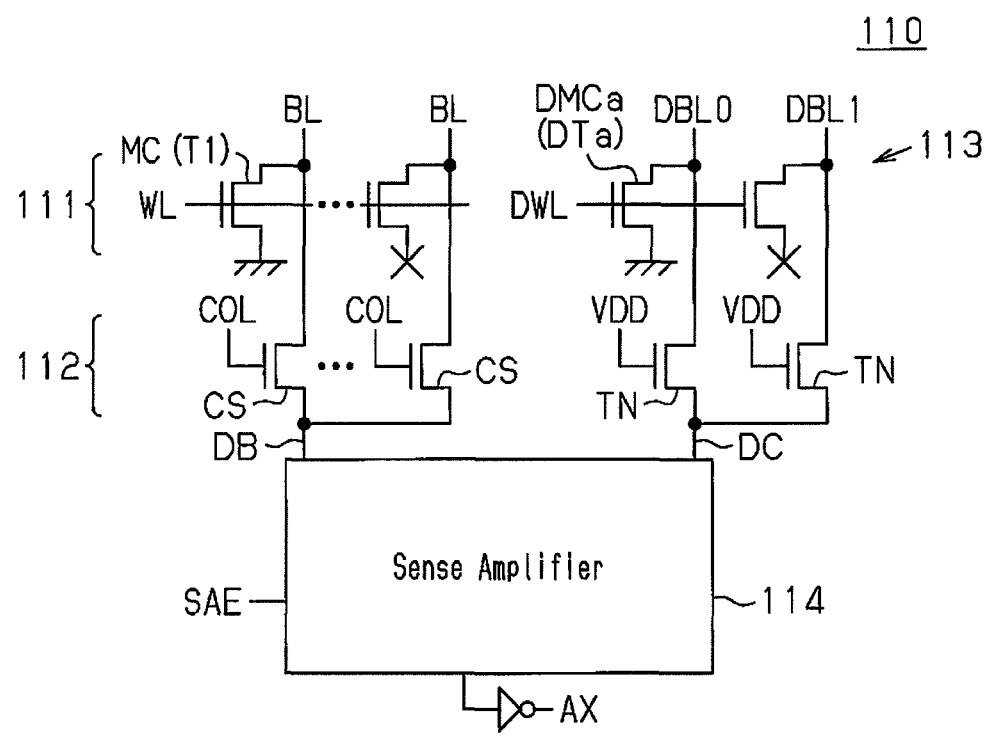
FIG. 23 is a block circuit diagram illustrating a conventional semiconductor memory device.

Next, the operation of the above semiconductor memory device 4 is described also with reference to FIG. 22. In FIG. 22, a vertical axis and a horizontal axis are illustrated at an enlarged or reduced scale to simplify description.

Here, an operation in the case of reading data "0" from the memory cell MC of the cell array 15D is described. Specifically, an operation when address signals A0 to Ak are provided to select the memory cell MC coupled to the bit line BL0D and the word line WL0D of the cell array 15D is described.

Precharging Operation

First, a precharging operation is performed before data readout from the cell array 15D is started. Specifically, if a clock signal CK rises to H level when a chip enable signal CE is at L level, a clock signal MCLK rises to H level (time t6) after the elapse of a predetermined time from that rise. A column selection signal C0D of H level and column selection signals C1D to C15D of L level are provided to the column switches SD in accordance with the clock signal MCLK of H level and the address signals A0 to Ak (time t7). This causes only the column switch SD coupled to the bit line BL0D to be turned on. At this time, since the transfer gate G3 is turned on in response to the control signal BLKDX of L level, the above bit line BL0D is coupled to the sense amplifier 90 via the data bit line DBD and the main bit line MBL0. In accordance with the above clock signal MCLK of H level and the address signals A0 to Ak, column selection signals C0U to C15U of H level are output and all the column switches SU are turned on. At this time, since the transfer gate G2 is turned off in response to the control signal BLKUX of H level, the bit lines BL0U to BL15U are commonly coupled to the NAND circuit 16.

Only the word line WL0D is activated out of the word lines WL0D to WLmD in accordance with the above clock signal MCLK of H level and the address signals A0 to Ak. By this, the cell transistors T1 coupled to the word line WL0D are turned on in the cell array 15D. The dummy word lines DWLU are activated in accordance with the above clock signal MCLK of H level and the address signals A0 to Ak. By this, the dummy transistors DT are turned on in the cell array 15U.

Further, precharge signals CH1, CH2 of L level are output for a predetermined period in accordance with the above clock signal MCLK of H level. Then, switch circuits S1, S2 are turned on in response to these precharge signals CH1, CH2 of L level, and the bit lines BL0U to BL15U, the bit lines BL0D, the data bit lines DBU, DBD and the main bit line MBL0 are precharged to H level. Thereafter, upon the elapse of the predetermined period (time t8), the precharge signals CH1, CH2 transition to H level and the switch circuits S1, S2 are turned off in response to the precharge signals CH1, CH2 of H level, wherefore the precharging operation is finished. During the precharging period, the signal U1 provided from the NAND circuit 16U of the cell array 15U falls to L level. On the other hand, the signal D1 provided from the NAND circuit 16D of the cell array 15D is kept at H level since the control signal BLKDX is at L level. At this time, the output signal of the NAND circuit 104 becomes H level and the output signal of the NAND circuit 106 becomes H level. Thus, the output signal of the NAND circuit 107 becomes L level and the latch signal La becomes H level.

Reading Operation

When the above precharging operation is finished (time t8), the charge of the bit line BL0D is discharged via the above turned-on cell transistors T1. As a result, the voltage of the bit line BL0D is gradually reduced. Further, since the charge of the bit line BL0D is transferred to the data bit line DBD and the main bit line MBL0, the voltages of the data bit line DBD and the main bit line MBL0 are also gradually reduced similarly to the bit line BL0D. At this time, since the transfer gate 92 is turned off in response to the latch signal La of H level in the sense amplifier 90, the voltage of the main bit line MBL0 is latched by the latch circuit 91 and the read data AX provided from the latch circuit 91 does not reach the latch circuit 93 via the transfer gate 92. At this time, since the transfer gate 95 is turned on in response to the latch signal La of H level, the above read data AX is not latched by the latch circuit 93 yet and the previous data is retained.

On the other hand, in the cell array 15U, the charges of the bit lines BL0U to BL15U are discharged via the above turned-on dummy transistors DT after the above precharging operation. As a result, the voltages of the bit lines BL0U to BL15U are gradually reduced.

Consequently, when the voltages of the bit lines BL0U to BL15U are reduced and the control signal U1 provided from the NAND circuit 16U transitions to H level, the output signal of the NAND circuit 104 becomes L level. Then, the output signal of the NAND circuit 107 becomes H level, wherefore the latch signal La becomes L level for an operation delay period of the inverter circuits 103, 108. In response to the latch signal La of L level, the transfer gate 92 of the sense amplifier 90 is turned on and the transfer gate 95 is turned off. By this, the read data AX provided to the latch circuit 91 immediately before the transfer gate 92 is turned on is output as output data A through the transfer gate 92. At this time, in this example, the read data AX of H level is output as the output data A since the voltage of the main bit line MBL0 falls substantially to L level and the read data AX of H level is output from the latch circuit 91. By setting an output timing of the transfer gate 92 utilizing the dummy transistors DT in this way, the read data AX may be normally output. Specifically, the dummy transistors DT are replica transistors which are replicas of the cell transistors T1 and loads similar to those of the cell transistors T1 are coupled thereto. Thus, the voltages of the bit lines BLU, BLD discharged by the dummy transistors DT and the cell transistors T1 are reduced substantially in a similar manner. After the bit lines discharged by the dummy transistors DT approach L level and the control signal U1 output from the NAND circuit 16U transitions to H level, a latch signal La of L level instructing an output from the transfer gate 92 is generated. In other words, after the main bit line MBL0 discharged by the cell transistor T1 approaches L level and the output signal of the inverter circuit 91a in the latch circuit 91, i.e. the read data AX transitions to H level, the above latch signal La of L level is generated. Therefore, the data read from the cell array may be normally output.

According to the fourth embodiment, the following effects may be achieved.

(1) In reading data from one cell array (e.g. cell array 15U), the latch signal La supplied to the sense amplifier 90 is generated by the dummy cells DMC provided in the other cell array (e.g. cell array 15D), i.e. in the cell array that is not accessed. The dummy cells DMC are coupled to the bit lines BLU, BLD coupled to the memory cells MC (real cells). That is, the memory cells MC and the dummy cells DMC share the bit lines BLU, BLD. By this, a layout area may be reduced as compared with the case where bit lines different from those for the memory cells MC are formed for a latch timing generation circuit (here, dummy cells DMC).

(2) For example, due to variations of a manufacturing process and a manufacturing line for semiconductor integrated circuits, on-resistances, threshold voltages and transistor sizes of the cell transistors T1 and the dummy transistors DT vary and a voltage amplitude of bit lines vary with time. Because of this, voltage drops of the bit lines BLD of the cell array to be accessed (e.g. cell array 15D) and voltage drops of the bit lines BLU of the cell array not to be accessed (e.g. cell array 15U) vary. Due to this variation, there is a problem of being unable to normally read data when the voltage of the data bit line DBU reaches L level much earlier than the voltage of the data bit line DBD at the time of reading the data "0".

Contrary to this, in the fourth embodiment, a plurality of (sixteen, for example) dummy cells DMC (latch timing generation circuit) are operated in generating the latch signal La. Since the variations of the dummy transistors DT are averaged by this, the characteristic variations of the dummy transistors DT may be made smaller. Thus, an influence caused by transistor manufacturing variations may be reduced and the latch signal La of L level may be generated at a desired timing.

Further, since the bit lines BLU, BLD coupled to the memory cells MC are shared by all of the plurality of dummy cells DMC at this time, an increase in the layout area may be effectively suppressed.

It should be apparent to those skilled in the art that the present invention may be embodied in many other specific forms without departing from the spirit or scope of the invention. Particularly, it should be understood that the present invention may be embodied in the following forms.

In the second and third embodiments, a precharging circuit 11 for precharging the bit lines BLU, BLD to H level may be provided as in the first embodiment.

In each embodiment, a plurality of dummy cells DMC are provided. Without being limited to this, for example, only one dummy cell DMC may be provided.

In the first to third embodiments, the dummy cells DMC are provided for n/2 bit lines BLU, BLD out of n bit lines BLU, BLD. Without being limited to this, the dummy cells DMC may be provided, for example, for all the n bit lines BLU, BLD. In this case, the dummy transistors DT are so formed that the on-resistances of the dummy transistors DT of the dummy cells DMC are twice those of the cell transistors T1 of the memory cells MC.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor memory device, comprising:
    two memory cell arrays;
    two column switch arrays respectively coupled to the two memory cell arrays;
    a sense amplifier shared by the two memory cell arrays and the two column switch arrays; and
    a control circuit configured to control data readout from the two memory cell arrays;

wherein each of the two memory dell arrays includes:
a plurality of word lines,
n bit lines, where n is an integer not smaller than 2,
a dummy word line,
a plurality of memory cells provided at intersections of the bit lines and the plurality of word lines, and
a dummy cell provided at an intersection of at least one bit line selected from the n bit lines and the dummy word line;
wherein the n bit lines of each of the two memory cell arrays and coupled to the same sense amplifier via the respective one of the column switch arrays and a common bit line that is commonly coupled to the n bit lines via the respective one of the column switch arrays,
wherein when the control circuit reads data from one memory cell array of the two memory cell arrays, the control circuit activates the dummy word line included in other memory cell array of the two memory cell arrays and generates, with the dummy cell included in the other memory cell array, a reference level of the sense amplifier; and
wherein:
each of the two column switch arrays includes:
n column switches respectively coupled to the n bit lines, and
the common bit line is commonly coupled to the n bit lines via the n column switches;
the sense amplifier is coupled to the two memory cell arrays via the common bit lines; and
when the control circuit reads data from the one memory cell array, the control circuit switches a selected column switch corresponding to the memory cell, from which the data is to be read, out of the n column switches in the one memory cell array and the n column switches in the other memory cell array to a conductive state to activate the word line corresponding to the memory cell, from which the date is to be read, in the one memory cell array and the dummy word line in the other memory cell array.

2. The semiconductor memory device according to claim 1, wherein:
each memory cell of the plurality of memory cells is a cell transistor including a gate coupled to a corresponding word line and a drain coupled to a corresponding bit line;
the dummy cell is a replica transistor which is a replica of the cell transistor and includes a gate coupled to the dummy word line, a drain coupled to the corresponding bit line and a grounded source; and
the dummy cell is provided at an intersection of each of n/2 bit ones out of the n bit lines and the dummy word line.

3. The semiconductor memory device according to claim 1, wherein;
each of the two memory cell arrays includes a first precharging circuit configured to precharge each of the n bit lines to a predetermined voltage and a second precharging circuit configured to precharge the common bit line to the predetermined voltage; and
when the control circuit reads data from the one memory cell array, the control circuit precharges the n bit lines of each of the two memory cell arrays by switching the n column switches in each of the two memory cell arrays to a conductive state and activating the first and second precharging circuits, and then activates the word lines in the one memory cell array and the dummy word line in the other memory cell array by inactivating the first and second precharging circuits, switching only the column switch corresponding to the memory cell, from which the data is read, out of the column switches in the one memory cell array to the conductive state and switching the n column switches in the other memory cell array to the conductive state.

4. The semiconductor memory device according to claim 1, wherein:
the semiconductor memory device includes a plurality of memory blocks each including first and second memory cell arrays as the two memory cells arrays and the sense amplifier;
the common bit lines include a plurality of first common bit lines respectively coupled to the first memory cell arrays of the plurality of memory blocks and a plurality of second common bit lines respectively coupled to the second memory cell arrays of the plurality of memory blocks;
the semiconductor memory device includes:
a plurality of first switch circuits are coupled between the plurality of first common bit lines, and
a plurality of second switch circuits are coupled between the plurality of second common bit lines; and
the control circuit configured to switch the plurality of first switch circuits to a conductive state and the plurality of second switch circuits to a nonconductive state when the dummy word line in the first memory cell array is activated, and switch the plurality of first switch circuits to a nonconductive state and the plurality of second switch circuits to a conductive state when the dummy word line in the second memory cell array is activated.

5. The semiconductor memory device according to claim 1, wherein:
each memory cell array includes a third switch circuit coupled between the bit lines; and
the control circuit short-circuits the bit lines to each other by switching the third switch circuit to a conductive state while the control circuit activates the dummy word line.

6. A semiconductor memory device, comprising:
two memory cell arrays;
two column switch arrays respectively coupled to the two memory cell arrays;
a sense amplifier shared by the two memory cell arrays and the two column switch arrays, and
a control circuit configured to control data readout from the two memory cell arrays;
wherein each of the two memory cell arrays includes;
a plurality of word lines,
n bit lines, where n is an integer not smaller than 2,
a dummy word line,
a plurality of memory cells provided at intersections of the bit lines and the plurality of word lines, and
a dummy cell provided at an intersection of at least one bit line selected from the n bit lines and the dummy word line;
wherein the n bit lines of each of the two memory cell arrays are coupled to the same sense amplifier via the respective one of the column switch arrays and a common bit line that is commonly coupled to the n bit lines via the respective one of the column switch arrays,
wherein when the control circuit reads data from one memory cell array of the two memory cell arrays, the control circuit activates the dummy word line included in other memory cell array of the two memory cell arrays and generates, with the dummy cell included in the other memory cell array, a reference level of the sense amplifier; and
wherein:
each memory cell array includes a memory cell-forming area and a dummy cell-forming area;

the memory cell-forming area includes:
first diffusion regions,
the n bit lines extending in a column direction, each bit line including a part formed on the first diffusion region,
first contacts for coupling the first diffusion regions with the bit lines,
a first word line formed on the first diffusion regions at a side away from the first contacts in a first direction and extending in a row direction perpendicular to the column direction,
a second word line formed on the first diffusion regions at a side away from the first contacts in a second direction opposite to the first direction and extending in the row direction,
a first power supply wiring formed on the first diffusion regions at a side away from the first word line in the first direction and extending in the row direction, and
a second power supply wiring formed on the first diffusion regions at a side away from the second word line in the second direction and extending in the row direction;
the memory cells being formed at sides away from the first contact as a center in the first and second directions; and
the dummy cell-forming area includes:
second diffusion regions,
the bit lines formed on the second diffusion regions and extending in the column direction,
second contacts for coupling the second diffusion regions with the bit lines,
a first dummy word line formed on the second diffusion regions at a side away from the second contacts in the first direction and extending in the row direction,
a second dummy word line formed on the second diffusion regions at a side away from the second contacts in the second direction and extending in the row direction,
a third power supply wiring formed on the second diffusion regions at a side away from the first dummy word line in the first direction and extending in the row direction, and
a fourth power supply wiring formed on the second diffusion regions at a side away from the second dummy word line in the second direction and extending in the row direction;
the dummy cells being formed on the second diffusion regions at sides away from the second contact as a center the first and second direction.

7. The semiconductor memory device according to claim 6, wherein, when the control circuit reads data from the one memory cell array, the control circuit:
activates the first dummy word line of the other memory cell array if the first word line of the one memory cell array is activated; and
activates the second dummy word line of the other memory cell array if the second word line of the one memory cell array is activated.

8. The semiconductor memory device according to claim 6, wherein, when the control circuit reads data from the one memory cell array, the control circuit activates the first and second dummy word lines of the other memory cell array if either one of the first and second word lines of the one memory cell array is activated.

9. A method for reading data from a semiconductor memory device, the semiconductor memory device including two memory cell arrays each including a plurality of word lines, n bit lines, where n is an integer not smaller than 2, a dummy word line, a plurality of memory cells provided at intersections of the bit lines and the plurality of word lines, and a dummy cell provided at an intersection of at least one bit line selected from the n bit lines and the dummy word line, two column switch arrays respectively coupled to the two memory cell arrays, and a sense amplifier shared by the two memory cell arrays and the two column switch arrays, wherein the n bit lines of each of the two memory cell arrays are coupled to the same sense amplifier via the respective one of the column switch arrays and a common bit line that is commonly coupled to the n bit lines via the respective one of the column switch arrays, the method comprising:
when data is read from one memory cell array of the two memory cell arrays, activating the dummy word line included in they memory cell array of the two memory cell arrays and generating, with the dummy cell included in the other memory cell array, a reference level of the sense amplifier;
wherein:
each of the two column switch arrays includes:
n column switches respectively coupled to the n bit lines, and
the common bit line is commonly coupled to the n bit lines via the n column switches;
the sense amplifier is coupled to the two memory cell arrays via the common bit lines; and
when data is read from the one memory cell array, switching a selected column switch corresponding to the memory cell, from which the data is to be read out of the n column switches in the one memory cell array and the n column switches in the other memory cell array to a conductive state to activate the word line corresponding to the memory cell, from which the data is to be read, in the one memory cell array and the dummy word line in the other memory cell array.

10. A method for reading data from a semiconductor memory device, the semiconductor memory device including two memory cell arrays each including a plurality of word lines, n bit lines, where n is an integer not smaller than 2 a dummy word line, a plurality of memory cells provided at intersections of the bit lines and the plurality of word lines, and a dummy cell provided at an intersection of at least one bit line selected from the n bit lines and the dummy word line, two column switch arrays respectively coupled to the two memory cell arrays, and a sense amplifier shared by the two memory cell arrays arid the two column switch arrays, wherein the n bit lines of each of the two memory cell arrays are coupled to the same sense amplifier via the respective one of the column switch arrays and a common bit line that is commonly coupled to the n bit lines via the respective one of the column switch arrays, the method comprising:
when data is read from: one memory cell array of the two memory cell arrays, activating the dummy word line included in other memory cell array of the two memory cell arrays and generating, with the dummy cell included in the other memory cell array, a reference level of the sense amplifier;
wherein;
each memory cell array includes a memory cell-forming area and a dummy cell-forming area;

the memory cell-forming area includes:
  first diffusion regions,
    the n bit lines extending in a column direction, each bit line including a part formed on the first diffusion region,
    first contacts for coupling the first diffusion regions with the bit lines,
    a first word line formed on the first diffusion regions at a side away from the first contacts in a first direction and extending in a row direction perpendicular to the column direction,
    a second word line formed on the first diffusion regions at a side away from the first contacts in a second direction opposite to the first direction and extending in the row direction,
    a first power supply wiring formed on the first diffusion regions at a side away from the first word line in the first direction and extending in the row direction, and
    a second power supply wiring formed on the first diffusion regions at a side away from the second word line in the second direction and extending in the row direction;
  the memory cells being formed at sides away from the first contact as a center in the first and second directions; and the dummy cell-forming area includes:
  second diffusion regions,
    the bit lines formed on the second diffusion regions and extending in the column direction,
    second contacts for coupling the second diffusion regions with the bit lines,
    a first dummy word line formed on the second diffusion regions at a side away from the second contacts in the first direction and extending in the row direction,
    a second dummy word line formed on the second diffusion regions at a side away from the second contacts in the second direction and extending in the row direction,
    a third power supply wiring formed on the second diffusion regions at a side away from the first dummy word line in the first direction and extending in the row direction, and
    a fourth power supply wiring formed on the second diffusion regions at a side away from the second dummy word line in the second direction and extending in the row direction;
  the dummy cells being formed on the second diffusion regions at sides away from the second contact as a center in the first and second direction.

\* \* \* \* \*